United States Patent
Rice et al.

(10) Patent No.: US 10,481,652 B2
(45) Date of Patent: Nov. 19, 2019

(54) MODULAR VEHICLE COMPUTING SYSTEM COOLING SYSTEMS

(71) Applicant: UATC, LLC, San Francisco, CA (US)

(72) Inventors: David Patrick Rice, Wexford, PA (US); Thomas Jeffrey Watson, Pittsburgh, PA (US); John William Zinn, Canonsburg, PA (US); Robert Henry Doll, Allison Park, PA (US); Declan Seamus Kelly, Pittsburgh, PA (US)

(73) Assignee: UATC, LLC, San Francisco, CA (US)

( * ) Notice: Subject to any disclaimer, the term of this patent is extended or adjusted under 35 U.S.C. 154(b) by 0 days.

(21) Appl. No.: 15/892,506

(22) Filed: Feb. 9, 2018

(65) Prior Publication Data

US 2019/0171258 A1    Jun. 6, 2019

Related U.S. Application Data

(60) Provisional application No. 62/593,454, filed on Dec. 1, 2017.

(51) Int. Cl.
*G06F 1/20* (2006.01)
*B60R 16/023* (2006.01)
(Continued)

(52) U.S. Cl.
CPC ............ *G06F 1/20* (2013.01); *B60R 16/0231* (2013.01); *F28D 15/0275* (2013.01);
(Continued)

(58) Field of Classification Search
CPC .. G06F 1/20; H05K 7/20136; H05K 7/20336; H05K 7/20854; H05K 7/20863;
(Continued)

(56) References Cited

U.S. PATENT DOCUMENTS

| 8,467,188 B2 | 6/2013 | Hsieh et al. |
| 9,445,526 B2 | 9/2016 | Zhou et al. |

(Continued)

OTHER PUBLICATIONS

Elma Electronics Inc., "3U Open VPX, Rugged ATR", Elma Solution Partner, http://www.elma.com, retrieved on Jan. 30, 2018, 2 pages.

Moll, "VXS and VPX: Cooling These Hot (Literally) New Architectures in ATRs", VITA Technologies, http://www.vita.mil-embedded.com/articles/vxs-vpx-literally-new-architectures-atrs/, retrieved on Jan. 30, 2018, 6 pages.

(Continued)

*Primary Examiner* — Mukundbhai G Patel
*Assistant Examiner* — Zhengfu J Feng
(74) *Attorney, Agent, or Firm* — Dority & Manning, P.A.

(57) ABSTRACT

Devices, systems, and methods for cooling an autonomous vehicle computing system are provided. A modular cooling device can include a cooling baseplate and one or more modular heat frames. The cooling baseplate can include at least one planar cooling surface, an inlet configured to receive a cooling fluid, an outlet, and at least one cooling channel coupled between the inlet and the outlet. The at least one cooling channel can be configured to allow the cooling fluid to flow between the inlet and the outlet and provide cooling to the at least one planar cooling surface. Each modular heat frame can be configured to house at least one autonomous vehicle computing system component, be coupled parallel to the at least one planar cooling surface, and transfer heat from the at least one autonomous vehicle computing system component housed by the modular heat frame to the cooling baseplate.

20 Claims, 10 Drawing Sheets

(51) Int. Cl.
*F28D 15/02* (2006.01)
*H05K 7/20* (2006.01)
*H01L 23/427* (2006.01)
*H01L 23/467* (2006.01)
*H01L 23/473* (2006.01)

(52) U.S. Cl.
CPC .......... *H01L 23/427* (2013.01); *H01L 23/467* (2013.01); *H01L 23/473* (2013.01); *H05K 7/20136* (2013.01); *H05K 7/20254* (2013.01); *H05K 7/20336* (2013.01); *H05K 7/20854* (2013.01); *H05K 7/20863* (2013.01); *H05K 7/20881* (2013.01); *H05K 7/20927* (2013.01); *B60Y 2306/05* (2013.01); *G06F 2200/201* (2013.01)

(58) Field of Classification Search
CPC ............ H05K 7/20881; F28D 15/0275; B60R 16/0231; B60Y 2306/05
See application file for complete search history.

(56) References Cited

U.S. PATENT DOCUMENTS

| | | | |
|---|---|---|---|
| 2005/0083655 A1 | 4/2005 | Jairazbhoy et al. | |
| 2007/0258216 A1* | 11/2007 | McBain | H05K 7/20154 361/707 |
| 2009/0140417 A1* | 6/2009 | Refai-Ahmed | H01L 23/3732 257/707 |
| 2009/0279247 A1* | 11/2009 | Chen | G06F 1/203 361/679.47 |
| 2011/0176279 A1* | 7/2011 | Zhao | H01L 21/4878 361/720 |
| 2015/0122465 A1* | 5/2015 | Mori | F28D 15/00 165/104.33 |
| 2015/0354902 A1* | 12/2015 | McDonald | F28D 15/0275 165/45 |

OTHER PUBLICATIONS

International Search Report and Written Opinion for Application No. PCT/US2018/063252, dated Feb. 15, 2019, 13 pages.

* cited by examiner

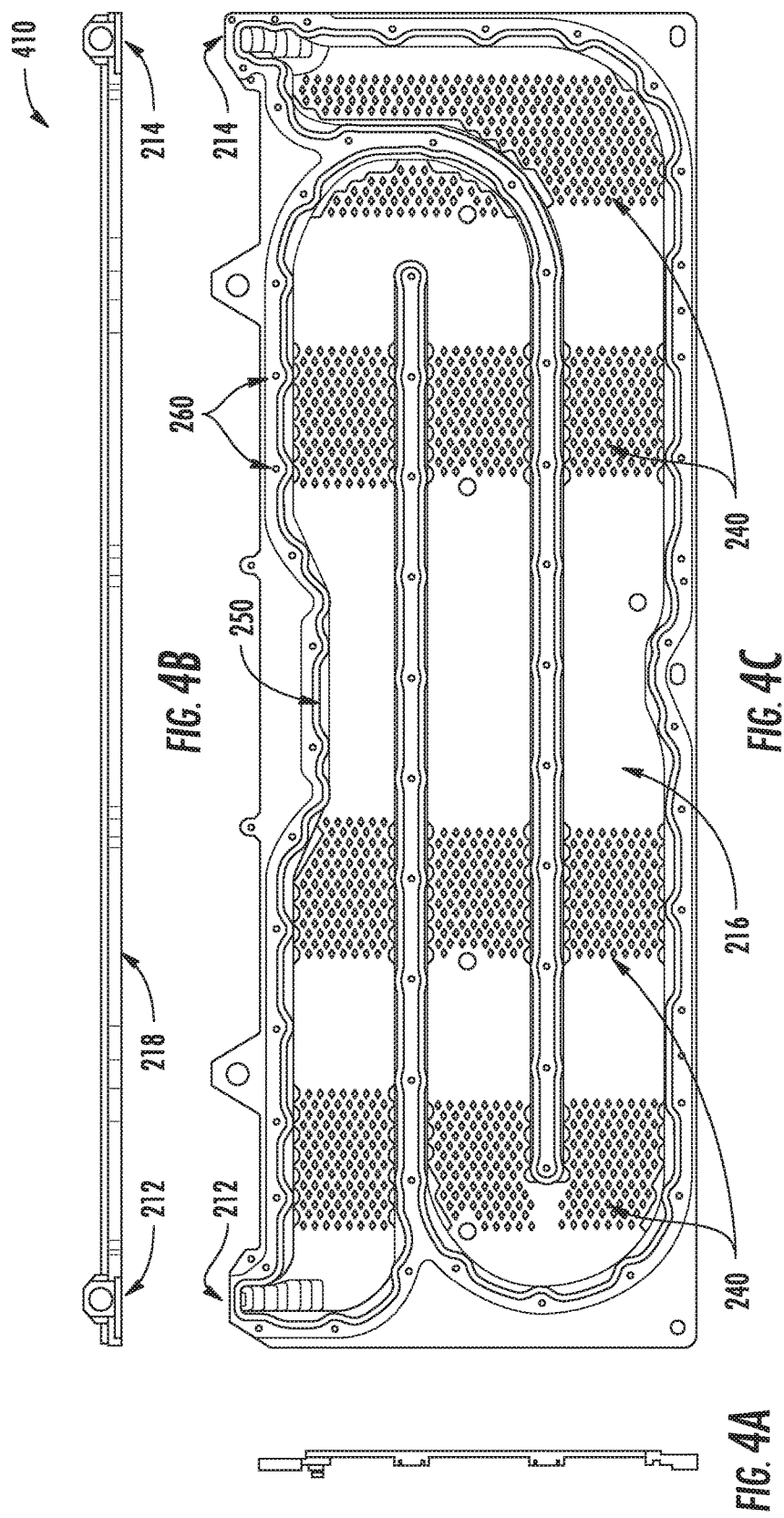

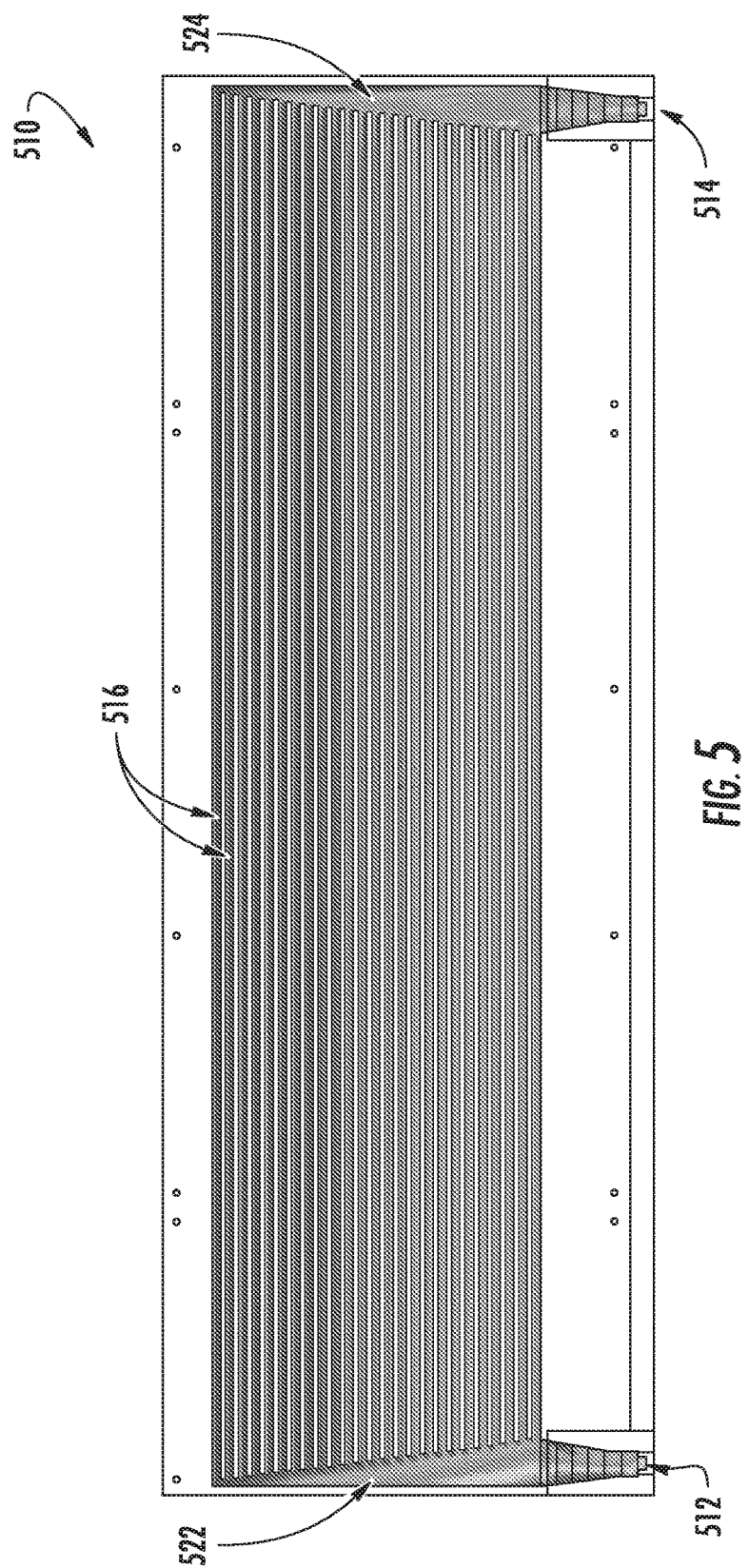

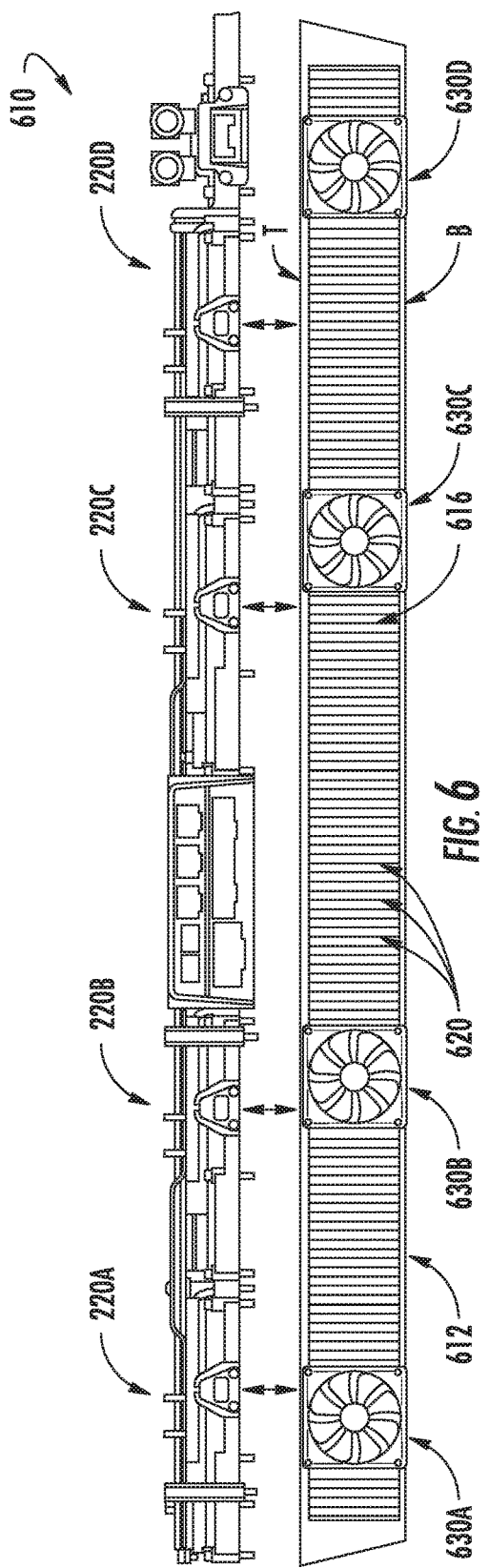

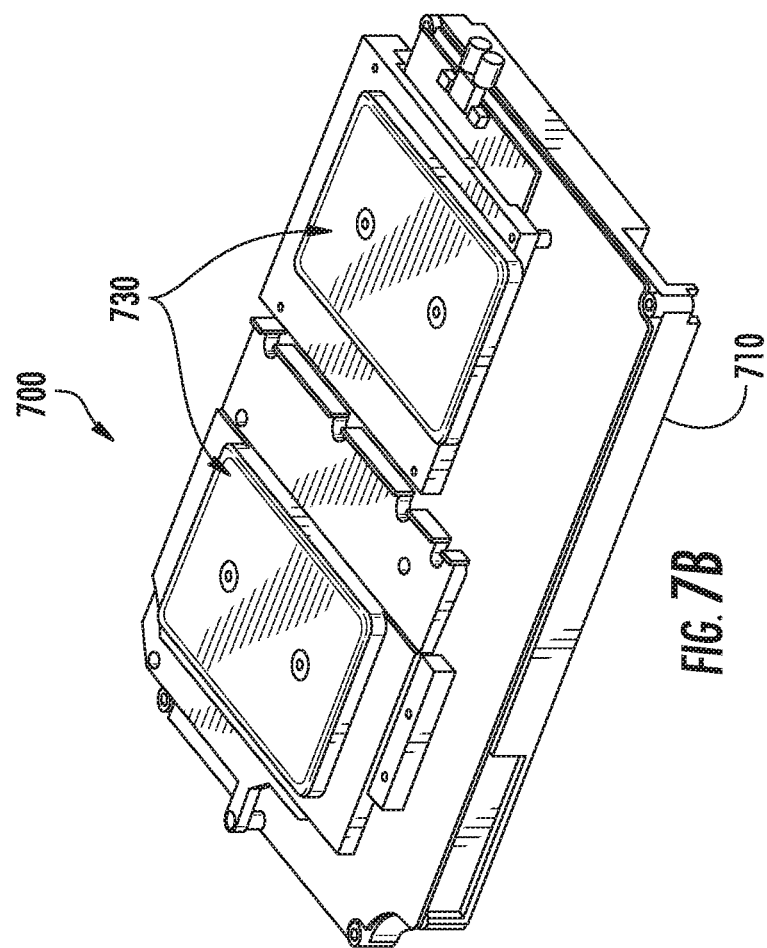
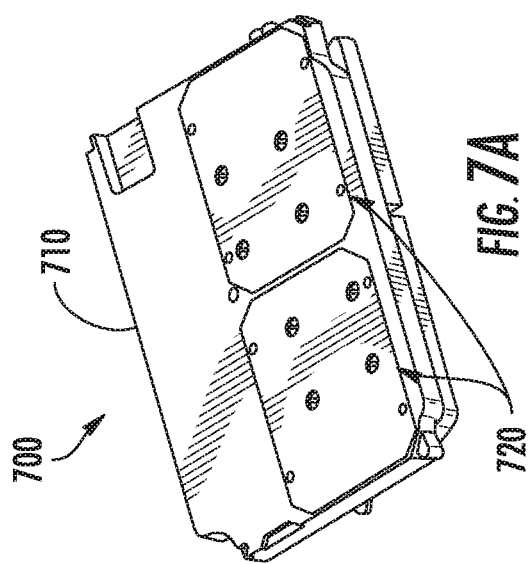

MODULAR VEHICLE COMPUTING SYSTEM COOLING SYSTEMS

PRIORITY CLAIM

The present application is based on and claims benefit of U.S. Provisional Application 62/593,454 having a filing date of Dec. 1, 2017, which is incorporated by reference herein.

FIELD

The present disclosure relates generally to devices, systems, and methods for cooling an autonomous vehicle computing system.

BACKGROUND

An autonomous vehicle is a vehicle that is capable of sensing its environment and navigating with minimal or no human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can identify an appropriate motion path through such surrounding environment.

In some implementations, an autonomous vehicle can include a computing system configured to assist in autonomous operation. The autonomous vehicle computing system can include processors, memory devices, or other components which may need to be operated at or below one or more temperature thresholds in order for the computing system to operate reliably. For example, operating the autonomous vehicle computing system may generate heat, which if not removed from one or more computing system components, may damage the one or more computing system components.

However, providing sufficient cooling to the computing system can present a challenge. For example, due to space constraints, the computing system may need to be located in a small compartment with little or no airflow. In such a configuration, the heat generated by the computing system may rapidly heat the small compartment, putting the computing system components at risk of overheating. Further, as computing systems are upgraded, a previously installed cooling system may become obsolete due to the new computing system components being incompatible with the previously installed cooling system.

SUMMARY

Aspects and advantages of embodiments of the present disclosure will be set forth in part in the following description, or can be learned from the description, or can be learned through practice of the embodiments.

One example aspect of the present disclosure is directed to a modular cooling device for an autonomous vehicle computing system. The modular cooling device can include a cooling baseplate. The cooling baseplate can include at least one planar cooling surface, an inlet configured to receive a cooling fluid, an outlet, and at least one cooling channel coupled between the inlet and the outlet. The at least one cooling channel can be configured to allow the cooling fluid to flow between the inlet and the outlet and provide cooling to the at least one planar cooling surface. The modular cooling device can further include one or more modular heat frames. Each modular heat frame can be configured to house at least one autonomous vehicle computing system component. Each modular heat frame can be further configured to be coupled parallel to the at least one planar cooling surface. Each modular heat frame can be further configured to transfer heat from the at least one autonomous vehicle computing system component housed by the modular heat frame to the cooling baseplate.

Another example aspect of the present disclosure is directed to a modular cooling system for an autonomous vehicle computing system. The modular cooling system can include a cooling fluid source and a modular cooling device. The modular cooling device can include a cooling baseplate. The cooling baseplate can include at least one planar cooling surface, an inlet configured to receive a cooling fluid from the cooling fluid source, an outlet, and one or more cooling channels coupled between the inlet and the outlet. The one or more cooling channels can be configured to allow the cooling fluid to flow between the inlet and the outlet and provide cooling to the at least one planar cooling surface. The modular cooling device can also include at least one modular heat frame. The at least one modular heat frame can be configured to house at least one autonomous vehicle computing system component. The at least one modular heat frame can be further configured to be coupled parallel to the at least one planar cooling surface. The at least one modular heat frame can be further configured to transfer heat from the at least one autonomous vehicle computing system component housed by the at least one modular heat frame to the cooling baseplate.

Another example aspect of the present disclosure is directed to an autonomous vehicle. The autonomous vehicle can include an autonomous vehicle computing system comprising a plurality of autonomous vehicle computing system components. The autonomous vehicle can further include a modular cooling system. The modular cooling system can include a cooling fluid source and a modular cooling device. The modular cooling device can include a cooling baseplate. The cooling baseplate can include at least one planar cooling surface, an inlet configured to receive a cooling fluid from the cooling fluid source, and outlet, and one or more cooling channels coupled between the inlet and the outlet. The one or more cooling channels can be configured to allow the cooling fluid to flow between the inlet and the outlet and provide cooling to the at least one planar cooling surface. The modular cooling device can further include at least one modular heat frame. Each modular heat frame can be configured to house at least one autonomous vehicle computing system component from the plurality. Each modular heat frame can be further configured to be coupled parallel to the at least one planar cooling surface. Each modular heat frame can be further configured to transfer heat from the at least one autonomous vehicle computing system component housed by the modular heat frame to the cooling baseplate.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which:

FIG. 4A depicts a side view of an example cooling baseplate according to example aspects of the present disclosure;

FIG. 4B depicts a side view of an example cooling baseplate according to example aspects of the present disclosure;

FIG. 4C depicts a top-down view of an example cooling baseplate according to example aspects of the present disclosure;

FIG. 5 depicts an example cooling baseplate including a plurality of cooling channels according to example aspects of the present disclosure;

FIG. 6 depicts an example air-cooled cooling baseplate according to example aspects of the present disclosure;

FIG. 7A depicts a perspective view of an example modular heat frame including a thermally-conductive heatsink according to example aspects of the present disclosure;

FIG. 7B depicts a perspective view of an example modular heat frame including a thermally-conductive heatsink according to example aspects of the present disclosure;

DETAILED DESCRIPTION

Figure 1:
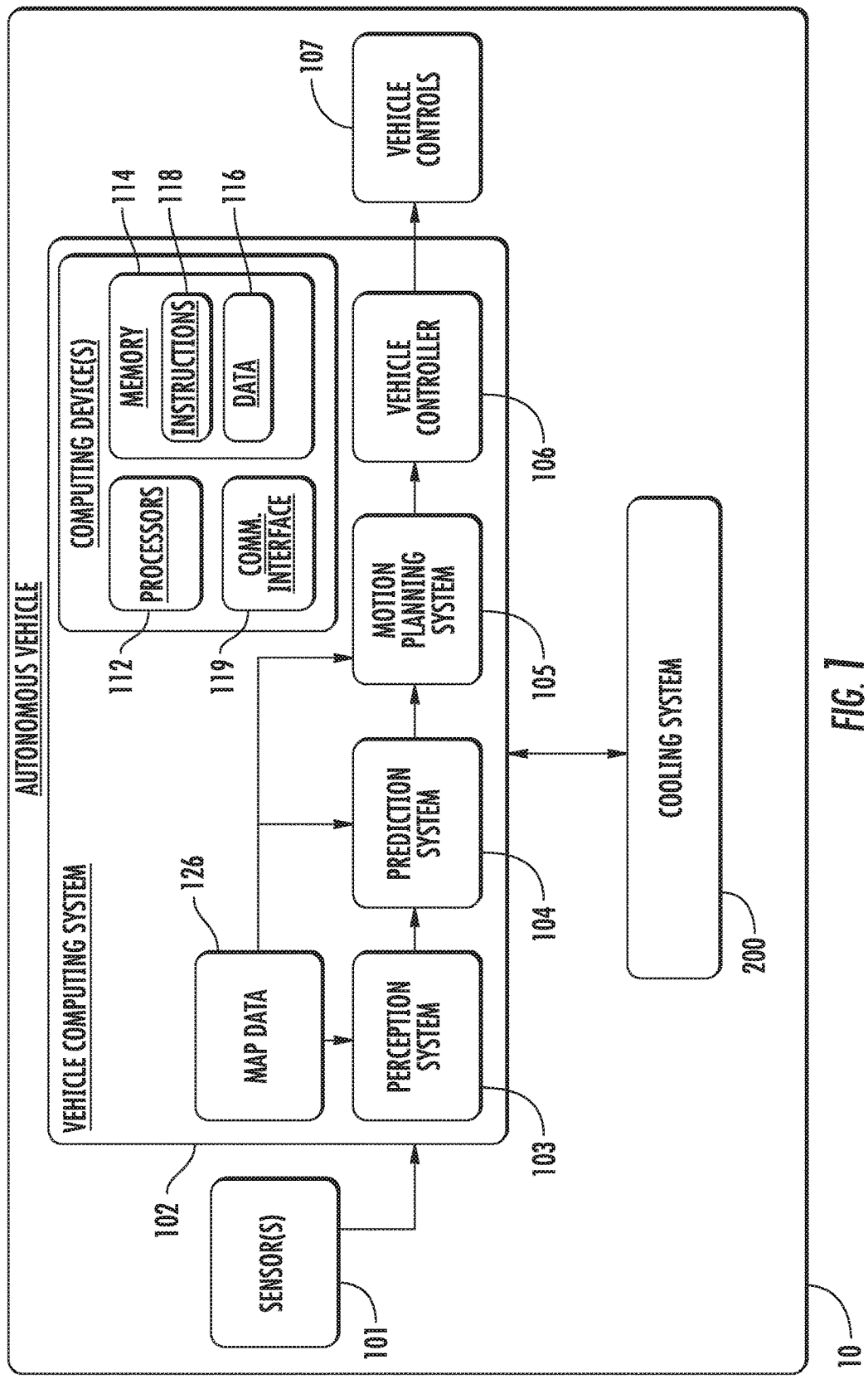
FIG. 1 depicts an example autonomous vehicle according to example aspects of the present disclosure.

Example aspects of the present disclosure are directed to devices and systems for cooling an autonomous vehicle computing system. For example, a modular cooling device can include a cooling baseplate and one or more modular heat frames. The cooling baseplate can generally be a cooling member configured to provide cooling to the one or more modular heat frames, and can include at least one planar cooling surface. For example, the cooling baseplate can include an inlet configured to receive a cooling fluid. In some implementations, the cooling fluid can be a liquid cooling fluid or a gaseous cooling fluid (e.g., air). The cooling baseplate can further include an outlet, and one or more cooling channels coupled between the inlet and the outlet. The one or more cooling channels can be configured to allow the cooling fluid to flow between the inlet and the outlet and provide cooling to the at least one planar cooling surface. For example, in some implementations, a liquid coolant can be provided by a cooling source to the inlet, the liquid coolant can absorb heat transferred to the cooling baseplate by the one or more modular heat frames, and after absorbing heat, exit the cooling baseplate through the outlet to return to the cooling source to be cooled further.

Each modular heat frame can be configured to house at least one autonomous vehicle computing system component. For example, in some implementations, a modular heat frame can be constructed out of a thermally-conductive material, and can be configured to house one or more computing system components, such as processors, memory devices, or other computing system components. Each modular heat frame can further be configured to transfer heat from the one or more autonomous vehicle computing system components housed by the modular heat frame to the cooling baseplate. For example, each modular heat frame can be configured to be coupled parallel to the at least one planar cooling surface, such as in a surface-mounted configuration. For example, in some implementations, each modular heat frame can include one or more vapor chambers, heat pipes, and/or thermally-conductive heatsinks configured to transfer heat from the one or more autonomous vehicle computing system components housed by the heat frame to the cooling baseplate. For example, in some implementations, each modular heat frame can be coupled to the cooling baseplate via a thermal grease, which can assist in transferring heat from the modular heat frame to a planar cooling surface of the cooling baseplate. In this way, the devices and systems of the present disclosure can allow for efficient heat transfer from one or more computing system components to a cooling fluid. Further, the modular devices and systems of the present disclosure can allow for individual computing system components to be replaced and/or incrementally upgraded without requiring the entire computing system and/or cooling system to be replaced.

More particularly, in some implementations, an autonomous vehicle can include a computing system which may need to be operated within a specified temperature range. For example, the vehicle computing system can assist in controlling the autonomous vehicle. The autonomous vehicle can be a ground-based autonomous vehicle (e.g., car, truck, bus, etc.), an air-based autonomous vehicle (e.g., airplane, drone, helicopter, or other aircraft), or other types of vehicles (e.g., watercraft). In some implementations, the vehicle computing system can include a vehicle autonomy system which includes one or more subsystems. For example, the vehicle autonomy system can include a perception system, a prediction system, and a motion planning system that cooperate to perceive the surrounding environment of the autonomous vehicle and determine a motion plan for controlling the motion of the autonomous vehicle accordingly.

For example, one or more sensors of the autonomous vehicle can obtain sensor data associated with one or more objects within the surrounding environment of the autonomous vehicle. The perception system can receive the sensor data and generate state data descriptive of the one or more objects, such as data describing the position, velocity, heading, acceleration, size, type, etc. for each object. The perception system can provide the state data indicative of the one or more objects to the prediction system, which can determine a predicted future state for each object perceived by the perception system. The motion planning system can determine a motion plan for the autonomous vehicle based on the objects within the surrounding environment, the predicted future states for the objects, and characteristics of the area in which the vehicle is travelling. A vehicle controller can control the motion of the autonomous vehicle based on the motion plan. In this way, an autonomous vehicle can perceive objects within a surrounding environment of autonomous vehicle, and, in response, control the autonomous vehicle accordingly.

In some implementations, the vehicle computing system can include one or more processors, one or more memory devices, or other components which should be operated below one or more temperature thresholds in order for the component to operate safely and reliably without damaging the component. For example, in some implementations, operating a vehicle computing system at too high of a temperature may reduce the expected service life of the computing system or permanently damage the computing system.

According to example aspects of the present disclosure, a modular cooling device can be configured to provide cooling to one or more components of an autonomous vehicle computing system. For example, a modular cooling device can include a cooling baseplate. The cooling baseplate can include at least one planar cooling surface, an inlet configured to receive a cooling fluid, and an outlet. One or more cooling channels can be coupled between the inlet and the outlet of the cooling baseplate. The one or more cooling channels can be configured to allow the cooling fluid to flow between the inlet and the outlet to absorb heat transferred to the cooling baseplate.

The modular cooling device can further include one or more modular heat frames. The cooling baseplate can be configured to provide cooling to one or more modular heat frames. For example, each modular heat frame can be configured to house at least one autonomous vehicle computing system component. For example, each modular heat frame can include a frame (e.g., an exterior casing) configured to house one or more processors, memory devices, graphics processing units (GPUs), printed chip boards (PCBs), or other computing system components. Each modular heat frame can be configured to transfer heat from the at least one autonomous vehicle computing system component housed by the modular heat frame to the cooling baseplate. For example, in some implementations, each modular heat frame can be constructed out of a thermally-conductive material, which can allow heat generated by the one or more computing system components housed by the modular heat frame to transfer to the modular heat frame and further to the cooling baseplate. Each modular heat frame can be configured to be coupled parallel to the at least one planar cooling surface. For example, in some implementations, each modular heat frame can be coupled to a respective position of the cooling baseplate (e.g., received into a socket or slot), and a thermal grease can be included between the modular heat frame and the cooling baseplate to aid in thermal transfer between the two pieces. As the cooling fluid provide cooling to the cooling baseplate, the cooling fluid can absorb heat transferred to the cooling baseplate from the one or more computing system components via the one or more modular heat frames.

In some implementations, the cooling fluid can be a liquid cooling fluid. For example, in some implementations, a liquid coolant can be circulated to the inlet of the cooling baseplate from a cooling fluid source. In some implementations, the cooling fluid source can include a thermal interface configured to receive cooling from various cooling sources, such as air-condition coolant systems, integrated coolant loops (e.g., battery coolant loops, powered electronics coolant loops), radiator coolant loops, or other cooling sources. For example, the cooling source can be configured to cool a liquid coolant, circulate the cooled liquid coolant to the inlet of the cooling baseplate where the liquid coolant can absorb heat from the cooling baseplate via the one or more cooling chambers, and receive the warmed liquid coolant via the outlet of the cooling baseplate. The cooling fluid source can then cool the liquid coolant further before recirculating the liquid coolant to the cooling baseplate. In some implementations, the cooling fluid can be an airflow, such as an ambient airflow or an airflow provided by a fan.

In some implementations, the cooling baseplate can include a plurality of pin fins positioned within the one or more cooling channels. For example, as the cooling fluid flows through the one or more cooling channels of the cooling baseplate, a plurality of pin fins can be positioned within the one or more cooling channels to aid in heat transfer from the one or more modular heat frames. For example, in some implementations, a plurality of pin fins can be positioned within the one or more cooling channels proximate to a modular heat frame coupled to the cooling baseplate. In some implementations, the plurality of pin fins can be machined, milled, cast, or otherwise included in a bottom plate of a cooling baseplate such that the pin fins can extend from the bottom plate to a top plate within the one or more cooling channels. As the cooling fluid flows through the one or more cooling channels, the plurality of pin fins (or a subset thereof associated with a modular heat frame) can be configured to transfer heat from the respective modular heat frame to the cooling baseplate, and further to the cooling fluid flowing through the one or more cooling channels. For example, in some implementations, a plurality of modular heat frames can be positioned on a cooling baseplate, and each respective modular heat frame can include a plurality of pin fins configured to transfer heat from the respective modular heat frame to the cooling baseplate. In some implementations, the plurality of pin fins associated with a respective modular heat frame can be localized on the cooling baseplate, such as positioned directly below the respective modular heat frame, in order to reduce the amount of pressure drop of the cooling fluid while still aiding in heat transfer from the respective modular heat frame.

In some implementations, the plurality of pin fins can include a plurality of diamond-shaped pin fins. For example, in some implementations, diamond-shaped pin fins can be milled into a bottom plate of a cooling baseplate and can be arranged in a grid-like pattern. For example, in some implementations, the diamond-shaped pin fins can have an angle of approximately 30 degrees on a leading edge of the pin fin to aid in diverting the cooling fluid flow around the diamond-shaped pin fins without overly impeding the flow of the cooling fluid or causing too large of a pressure drop. An advantage provided by diamond-shaped pin fins is that the pin fins can be readily milled into a bottom plate of a cooling baseplate.

In some implementations, the plurality of pin fins can include a plurality of rounded pin fins. For example, in some implementations, rounded pin fins can generally have a rounded shape (i.e., a circular or oval shape). For example, rather than having an angled leading edge such as on a diamond-shaped pin fin, the rounded pin fins can have a curved or rounded shape. An advantage provided by rounded pin fins is that as the cooling fluid flows around the rounded pin fins, a turbulence in the cooling fluid flow can be created, which can assist in additional heat transfer.

In some implementations, the cooling baseplate can include a single cooling channel. For example, in some implementations, the single cooling channel can include a single flow path between the inlet and the outlet, and can be arranged in a straight configuration or can include one or more bends. In one example implementation, the inlet can be positioned on the cooling baseplate on a side opposite the outlet, and the cooling baseplate can include a single cooling channel which can include three essentially parallel flow paths coupled by two U-shaped bends. Other suitable single cooling channel configurations can also be used.

In some implementations, cooling baseplate can include a plurality of cooling channels. For example, in some implementations, the cooling baseplate can include a first manifold associated with the inlet, and a second manifold associated with the outlet. The plurality of cooling channels can be coupled between the first manifold and the second manifold. For example, the first manifold can be configured to distribute the cooling fluid from the inlet to the plurality of cooling channels, and the second manifold can be configured to receive the cooling fluid from the plurality of cooling channels and provide the cooling fluid to the outlet. In some implementations, the plurality of cooling channels can be arranged in a parallel configuration.

In some implementations, the cooling fluid can be a gaseous cooling fluid, such as air. For example, the inlet can be positioned on a first side of the cooling baseplate, and the outlet can be positioned on an opposite side. The cooling baseplate can further include a cooling channel between the inlet and the outlet, and a plurality of cooling fins can be positioned within the cooling channel. For example, in some implementations, the cooling baseplate can be cast, machined, or milled out of metal, such as copper or aluminum. The cooling fins can similarly be constructed out of a thermally-conductive material, such as aluminum or copper, and can extend into the cooling channel. Heat can be transferred from the one or more modular heat frames to the cooling baseplate, and can be dissipated via the cooling fins positioned in the cooling channel.

In some implementations, one or more fans can be configured to provide a cooling airflow to the cooling channel. For example, one or more fans can be positioned proximate to the inlet and the cooling fluid can be a cooling airflow provided by the one or more fans. In some implementations, each modular heat frame can include a fan associated with the modular heat frame configured to provide a cooling air flow to an area of the cooling baseplate proximate to the respective modular heat frame. In some implementations, a single fan can provide a cooling airflow to the cooling baseplate. In some implementations, the cooling fluid can be an ambient airflow, such as an airflow provided due to the motion of the vehicle or other ambient airflow.

In some implementations, the cooling baseplate can include a bottom plate and a top plate fastened together via one or more mechanical fasteners (e.g., screws) and can include a gasket coupled between the top plate and the bottom plate in order to seal the one or more cooling chambers. In some implementations, the cooling baseplate can be manufactured by casting, milling, additive manufacturing, or other suitable manufacturing process. In some implementations, a bottom plate and a top plate of a cooling baseplate can be coupled together by welding, brazing, or other suitable process.

In some implementations, the inlet and the outlet can be positioned proximate to one another on the cooling baseplate. For example, in some implementations, the cooling baseplate can be generally rectangular in shape, and both the inlet and outlet can be positioned on the same side of the cooling baseplate and on the same end of the cooling baseplate. In other implementations, the inlet and the outlet can be positioned at opposite ends of the same side of the cooling baseplate. In yet other implementations, the inlet and the outlet can be positioned on opposite sides and opposite ends of the cooling baseplate. Any number of suitable inlet and outlet configurations can be used to accommodate different configurations within a vehicle. Further, any number of suitable cooling channel configurations can be used between the inlet and the outlet.

In some implementations, the cooling baseplate can be configured to receive a plurality of modular heat frames. For example, a plurality of modular heat frames can be coupled to the cooling baseplate in a co-planar, surface-mounted configuration, such as by receiving each modular heat frame into a respective socket of the cooling baseplate or a respective position on the cooling baseplate. In some implementations, a thermal grease can be applied between each modular heat frame and the cooling baseplate to assist in thermal transfer between the cooling baseplate and the respective modular heat frame.

In some implementations, a modular heat frame can include one or more vapor chambers configured to transfer heat from the one or more computing system components housed by the modular heat frame. For example, in some implementations, the one or more vapor chambers can be constructed out of a thermally-conductive material (e.g., copper, aluminum, etc.) and can include a phase transition liquid. In some implementations, the one or more vapor chambers can be positioned between the one or more computing system components housed by the modular heat frame and the cooling baseplate. For example, the one or more computing system components housed by the modular heat frame can be positioned on top of the one or more vapor chambers to allow for heat generated by the one or more computing system components to be transferred to the one or more vapor chambers. Further, in some implementations, the one or more vapor chambers can be positioned on a bottom portion of the modular heat frame. In some implementations, the modular heat frame can then be positioned on the cooling baseplate such that heat can be transferred from the one or more vapor chambers of the modular heat frame to the cooling baseplate. For example, in some implementations, a modular heat frame can be received into a corresponding socket of a cooling baseplate and the modular heat frame can be thermally coupled to the cooling baseplate such as, for example, by a thermal grease applied between the vapor chamber of the modular heat frame and the top plate of the cooling baseplate. As the phase transition liquid in the vapor chamber proximate to the one or more computing system components heats up, the phase transition liquid can turn into a vapor and travel to cooling baseplate side of the vapor chamber. As the phase transition liquid then cools down, heat can be transferred from the phase transition liquid to the cooling baseplate.

In some implementations, a modular heat frame can include one or more heat pipes configured to transfer heat from the one or more computing system components housed by the modular heat frame. For example, in some implementations, the one or more heat pipes can be constructed out of a thermally-conductive material (e.g., copper, aluminum, etc.) and can include a phase transition liquid. In some implementations, a first end of a heat pipe can be positioned on top of the one or more computing system components housed by the modular heat frame to allow for heat generated by the one or more computing system components to be transferred to the one or more heat pipes. In some implementations, a second end of a heat pipe can be configured to transfer heat to a bottom portion of the modular heat frame, such as a heatsink or other heat transfer device. As the liquid in the first side of the heat pipe absorbs heat from the one or more computing system components, the phase transition liquid can turn into a vapor and travel to the second side of the heat pipe. As the phase transition liquid cools at the second side of the heat pipe, heat can be transferred from the phase transition liquid to the second side. Further, in some implementations, the modular heat frame can then be positioned on the cooling baseplate such that heat can be transferred from the heat pipe of the modular heat frame to the cooling baseplate. For example, in some implementations, a modular heat frame can be received into a corresponding socket of a cooling baseplate and the modular heat frame can be thermally coupled to the cooling baseplate such as, for example, by a thermal grease applied between the heatsink or other heat transfer device of the modular heat frame and a top plate of the cooling baseplate.

In some implementations, a modular heat frame can include one or more thermally-conductive heatsinks configured to transfer heat from the one or more computing system components housed by the modular heat frame. For example, in some implementations, the one or more heatsinks can be constructed out of a thermally-conductive material (e.g., copper, aluminum, thermally-conductive plastic, etc.). In some implementations, the one or more computing system components housed by the modular heat frame can be positioned on top of the one or more heatsinks to allow for heat generated by the one or more computing system components to be transferred to the one or more heatsinks. In some implementations, the one or more heatsinks can be positioned on a bottom of the modular heat frame. Further, in some implementations, the modular heat frame can then be positioned on the cooling baseplate such that heat can be transferred from a heatsink of the modular heat frame to the cooling baseplate. For example, in some implementations, a modular heat frame can be received into a corresponding socket of a cooling baseplate and the modular heat frame can be thermally coupled to the cooling baseplate such as, for example, by a thermal grease applied between the heatsink of the modular heat frame and the top plate of the cooling baseplate.

In some implementations, a modular heat frame can include one or more air-cooled heatsinks configured to transfer heat from the one or more computing system components housed by the modular heat frame to an ambient air surrounding the modular heat frame. For example, in some implementations, an air-cooled heatsink can be positioned on top of the one or more computing system components housed by the modular heat frame. In some implementations, the air-cooled heatsink can include a plurality of thermally-conductive fins positioned on top of the air-cooled heatsink. The heatsink can be constructed out of a thermally-conductive material, such as aluminum or copper. Heat can be transferred from the one or more computing system components housed by the modular heat frame to the thermally-conductive heatsink, and dissipated into the ambient air surrounding the modular heat frame via the plurality of thermally-conductive fins.

In some implementations, each modular heat frame can be constructed out of a thermally-conductive material, such as copper, aluminum, or thermally-conductive plastic. For example, each heat frame can be can be manufactured by casting, milling, additive manufacturing, or other suitable manufacturing process. An advantage provided by manufacturing the modular heat frames out of a thermally-conductive material is the ability of the entire modular heat frame to assist in heat transfer between the one or more computing system components housed by the modular heat frame and the cooling baseplate and/or an ambient air. For example, heat can be transferred via conduction from the modular heat frame to the cooling baseplate, and can be transferred via radiation to the ambient air surrounding the modular heat frame.

The systems and devices described herein may provide a number of technical effects and benefits. For example, the systems and devices according to example aspects of the present disclosure can allow for efficient heat removal from an autonomous vehicle computing system. For example, heat generated by one or more computing system components of an autonomous vehicle can be transferred to a cooling fluid (e.g., liquid coolant and/or air) in order to allow for the autonomous vehicle computing system to be operated safely, reliably, and within any applicable temperature constraints.

Further, by managing the operating temperature of an autonomous vehicle computing system, the likelihood of damage caused by overheating of computing system components can be reduced. Thus, the expected service life for individual components can be extended. Further, the systems and devices described herein can allow for the increased reliability of an autonomous vehicle computing system. By helping to ensure that the autonomous vehicle computing system operates reliably, passenger safety and convenience can be increased.

Additionally, the systems and devices according to example aspects of the present disclosure can provide increased flexibility in designing a modular cooling device and/or system for an autonomous vehicle. For example, the devices and systems described herein can allow for liquid or air to be used to provide cooling to a cooling baseplate. Additionally, a single cooling channel or a plurality of cooling channels can be included in a cooling baseplate, and pin fins can be used to increase the thermal transfer between a modular heat frame and a cooling baseplate. Moreover, the modular heat frames provided by the present disclosure can allow for vapor chambers, heat pipes, thermally-conductive heatsinks, and/or air-cooled heatsinks to provide for efficient heat removal from computing system components. By using one or more of these heat transfer devices, higher power density chipsets can be incorporated into an autonomous vehicle computing system, allowing for increased performance of the computing system. Thus, the devices and systems of the present disclosure provide flexible cooling options for a variety of autonomous vehicle applications.

Moreover, the modular devices and systems according to example aspects of the present disclosure can allow for individual computing system components to be upgraded, repaired, and/or replaced in an efficient and cost-effective manner. For example, should a computing system component need to be replaced, the modular heat frame associated with the computing system component can be removed and a replacement modular heat frame with the replacement component can be inserted in its place. Further, as advances in computing system technology are made, individual computing system components can be upgraded by replacing the modular heat frame associated with the components. Thus, the systems and devices according to example aspects of the present disclosure allow for incremental upgrades and/or repairs to be made to an autonomous vehicle computing system without requiring the entire computing system and/or cooling system to be replaced.

With reference now to the FIGS., example aspects of the present disclosure will be discussed in further detail. FIG. 1 depicts a block diagram of an example vehicle 10 according to example aspects of the present disclosure. Vehicle 10 can be, for example, an autonomous vehicle. The vehicle 10 can include one or more sensors 101, a vehicle computing system 102, and one or more vehicle controls 107. The vehicle computing system 102 can assist in controlling the vehicle 10. In particular, the vehicle computing system 102 can receive sensor data from the one or more sensors 101, attempt to comprehend the surrounding environment by performing various processing techniques on data collected by the sensors 101, and generate an appropriate motion path through such surrounding environment. The vehicle computing system 102 can control the one or more vehicle controls 107 to operate the vehicle 10 according to the motion path.

The vehicle computing system 102 can include one or more computing devices 111. The one or more computing devices 111 can include one or more processors 112 and one or more memory 114. The one or more processors 112 can be any suitable processing device (e.g., a processor core, a microprocessor, an ASIC, a FPGA, a computing device, a microcontroller, etc.) and can be one processor or a plurality of processors that are operatively connected. The one or more memory 114 can include one or more non-transitory computer-readable storage mediums, such as RAM, ROM, EEPROM, EPROM, flash memory devices, magnetic disks, etc., and combinations thereof. The memory 114 can store data 116 and instructions 118 which can be executed by the processor 112 to cause vehicle computing system 102 to perform operations. The one or more computing devices 111 can also include a communication interface 119, which can allow the one or more computing devices 111 to communicate with other components of the vehicle 10 or external computing systems, such as via one or more wired or wireless networks.

As illustrated in FIG. 1, the vehicle computing system 102 can include a perception system 103, a prediction system 104, and a motion planning system 105 that cooperate to perceive the surrounding environment of the vehicle 10 and determine a motion plan for controlling the motion of the vehicle 10 accordingly. In some implementations, the perception system 103, the prediction system 104, the motion planning system 105 can be included in or otherwise a part of a vehicle autonomy system. As used herein, the term "vehicle autonomy system" refers to a system configured to control the movement of an autonomous vehicle.

In particular, in some implementations, the perception system 103 can receive sensor data from the one or more sensors 101 that are coupled to or otherwise included within the vehicle 10. As examples, the one or more sensors 101 can include a Light Detection and Ranging (LIDAR) system, a Radio Detection and Ranging (RADAR) system, one or more cameras (e.g., visible spectrum cameras, infrared cameras, etc.), and/or other sensors. The sensor data can include information that describes the location of objects within the surrounding environment of the vehicle 10.

As one example, for a LIDAR system, the sensor data can include the location (e.g., in three-dimensional space relative to the LIDAR system) of a number of points that correspond to objects that have reflected a ranging laser. For example, a LIDAR system can measure distances by measuring the Time of Flight (TOF) that it takes a short laser pulse to travel from the sensor to an object and back, calculating the distance from the known speed of light.

As another example, for a RADAR system, the sensor data can include the location (e.g., in three-dimensional space relative to the RADAR system) of a number of points that correspond to objects that have reflected a ranging radio wave. For example, radio waves (e.g., pulsed or continuous) transmitted by the RADAR system can reflect off an object and return to a receiver of the RADAR system, giving information about the object's location and speed. Thus, a RADAR system can provide useful information about the current speed of an object.

As yet another example, for one or more cameras, various processing techniques (e.g., range imaging techniques such as, for example, structure from motion, structured light, stereo triangulation, and/or other techniques) can be performed to identify the location (e.g., in three-dimensional space relative to the one or more cameras) of a number of points that correspond to objects that are depicted in imagery captured by the one or more cameras. Other sensor systems can identify the location of points that correspond to objects as well.

As another example, the one or more sensors 101 can include a positioning system. The positioning system can determine a current position of the vehicle 10. The positioning system can be any device or circuitry for analyzing the position of the vehicle 10. For example, the positioning system can determine a position by using one or more of inertial sensors, a satellite positioning system, based on IP address, by using triangulation and/or proximity to network access points or other network components (e.g., cellular towers, WiFi access points, etc.) and/or other suitable techniques. The position of the vehicle 10 can be used by various systems of the vehicle computing system 102.

Thus, the one or more sensors 101 can be used to collect sensor data that includes information that describes the location (e.g., in three-dimensional space relative to the vehicle 10) of points that correspond to objects within the surrounding environment of the vehicle 10. In some implementations, the sensors 101 can be located at various different locations on the vehicle 10. As an example, in some implementations, one or more cameras and/or LIDAR sensors can be located in a pod or other structure that is mounted on a roof of the vehicle 10 while one or more RADAR sensors can be located in or behind the front and/or rear bumper(s) or body panel(s) of the vehicle 10. As another example, camera(s) can be located at the front or rear bumper(s) of the vehicle 10 as well. Other locations can be used as well.

In addition to the sensor data, the perception system 103 can retrieve or otherwise obtain map data 126 that provides detailed information about the surrounding environment of the vehicle 10. The map data 126 can provide information regarding: the identity and location of different travelways (e.g., roadways), road segments, buildings, or other items or objects (e.g., lampposts, crosswalks, curbing, etc.); the location and directions of traffic lanes (e.g., the location and direction of a parking lane, a turning lane, a bicycle lane, or other lanes within a particular roadway or other travelway); traffic control data (e.g., the location and instructions of signage, traffic lights, or other traffic control devices); and/or any other map data that provides information that assists the vehicle computing system 102 in comprehending and perceiving its surrounding environment and its relationship thereto.

The perception system 103 can identify one or more objects that are proximate to the vehicle 10 based on sensor data received from the one or more sensors 101 and/or the map data 126. In particular, in some implementations, the perception system 103 can determine, for each object, state data that describes a current state of such object (also referred to as features of the object). As examples, the state data for each object can describe an estimate of the object's: current location (also referred to as position); current speed (also referred to as velocity); current acceleration; current heading; current orientation; size/shape/footprint (e.g., as represented by a bounding shape such as a bounding polygon or polyhedron); type/class (e.g., vehicle versus pedestrian versus bicycle versus other); yaw rate; distance from the vehicle 10; minimum path to interaction with the vehicle 10; minimum time duration to interaction with the vehicle 10; and/or other state information.

In some implementations, the perception system 103 can determine state data for each object over a number of iterations. In particular, the perception system 103 can update the state data for each object at each iteration. Thus, the perception system 103 can detect and track objects (e.g., vehicles) that are proximate to the vehicle 10 over time.

The prediction system 104 can receive the state data from the perception system 103 and predict one or more future locations for each object based on such state data. For example, the prediction system 104 can predict where each object will be located within the next 5 seconds, 10 seconds, 20 seconds, etc. As one example, an object can be predicted to adhere to its current trajectory according to its current speed. As another example, other, more sophisticated prediction techniques or modeling can be used.

The prediction system 104 can generate prediction data associated with each of the respective one or more objects within the surrounding environment of the vehicle 10. The prediction data can be indicative of one or more predicted future locations of each respective object. For example, the prediction data can be indicative of a predicted trajectory (e.g., predicted path) of at least one object within the surrounding environment of the vehicle 10. For example, the predicted trajectory (e.g., path) can indicate a path along which the respective object is predicted to travel over time (and/or the speed at which the object is predicted to travel along the predicted path).

For example, in some implementations, the prediction system 104 can be a goal-oriented prediction system that generates one or more potential goals, selects one or more of the most likely potential goals, and develops one or more trajectories by which the object can achieve the one or more selected goals. For example, the prediction system 104 can include a scenario generation system that generates and/or scores the one or more goals for an object and a scenario development system that determines the one or more trajectories by which the object can achieve the goals. In some implementations, the prediction system 104 can include a machine-learned goal-scoring model, a machine-learned trajectory development model, and/or other machine-learned models.

In some implementations, the prediction system 104 can use state data indicative of an object type or classification to predict a trajectory for the object. As an example, the prediction system 104 can use state data provided by the perception system 103 to determine that particular object (e.g., an object classified as a vehicle) approaching an intersection and maneuvering into a left-turn lane intends to turn left. In such a situation, the prediction system 104 can predict a trajectory (e.g., path) corresponding to a left-turn for the vehicle such that the vehicle turns left at the intersection. Similarly, the prediction system 104 can determine predicted trajectories for other objects, such as bicycles, pedestrians, parked vehicles, etc. The prediction system 104 can provide the predicted trajectories associated with the object(s) to the motion planning system 105.

The motion planning system 105 can determine a motion plan for the vehicle 10 based at least in part on the predicted trajectories associated with the objects within the surrounding environment of the vehicle and/or the state data for the objects provided by the perception system 103. Stated differently, given information about the current locations of objects and/or predicted trajectories of objects within the surrounding environment of the vehicle 10, the motion planning system 105 can determine a motion plan for the vehicle 10 that best navigates the vehicle 10 relative to the objects at such locations and their predicted trajectories.

In some implementations, the motion planning system 105 can evaluate one or more cost functions and/or one or more reward functions for each of one or more candidate motion plans for the vehicle 10. For example, the cost function(s) can describe a cost (e.g., over time) of adhering to a particular candidate motion plan while the reward function(s) can describe a reward for adhering to the particular candidate motion plan. For example, the reward can be of opposite sign to the cost.

Thus, given information about the current locations and/or predicted future locations/trajectories of objects, the motion planning system 105 can determine a total cost (e.g., a sum of the cost(s) and/or reward(s) provided by the cost function(s) and/or reward function(s)) of adhering to a particular candidate pathway. The motion planning system 105 can select or determine a motion plan for the vehicle 10 based at least in part on the cost function(s) and the reward function(s). For example, the motion plan that minimizes the total cost can be selected or otherwise determined. The motion plan can be, for example, a path along which the vehicle 10 will travel in one or more forthcoming time periods. The motion planning system 105 can provide the selected motion plan to a vehicle controller 106 that controls one or more vehicle controls 107 (e.g., actuators or other devices that control gas flow, steering, braking, etc.) to execute the selected motion plan. In some implementations, the motion planning system 105 can be configured to iteratively update the motion plan for the vehicle 10 as new sensor data is obtained from one or more sensors 101. For example, as new sensor data is obtained from one or more sensors 101, the sensor data can be analyzed by the perception system 103, the prediction system 104, and the motion planning system 105 to determine the motion plan.

Each of the perception system 103, the prediction system 104, and the motion planning system 105 can be included in or otherwise a part of a vehicle autonomy system configured to determine a motion plan based at least in part on data obtained from one or more sensors 101. For example, data obtained by one or more sensors 101 can be analyzed by each of the perception system 103, the prediction system 104, and the motion planning system 105 in a consecutive fashion in order to develop the motion plan. While FIG. 1 depicts elements suitable for use in a vehicle autonomy system according to example aspects of the present disclosure, one of ordinary skill in the art will recognize that other vehicle autonomy systems can be configured to determine a motion plan for an autonomous vehicle based on sensor data.

Each of the perception system 103, the prediction system 104, the motion planning system 105, and the vehicle controller 106 can include computer logic utilized to provide desired functionality. In some implementations, each of the perception system 103, the prediction system 104, the motion planning system 105, and the vehicle controller 106 can be implemented in hardware, firmware, and/or software controlling a general purpose processor. For example, in some implementations, each of the perception system 103, the prediction system 104, the motion planning system 105, and the vehicle controller 106 includes program files stored on a storage device, loaded into a memory and executed by one or more processors. In other implementations, each of the perception system 103, the prediction system 104, the motion planning system 105, and the vehicle controller 106 includes one or more sets of computer-executable instructions that are stored in a tangible computer-readable storage medium such as RAM hard disk or optical or magnetic media.

The vehicle 10 can further include a cooling system 200 configured to provide cooling to the vehicle computing system 102.

Figure 2:
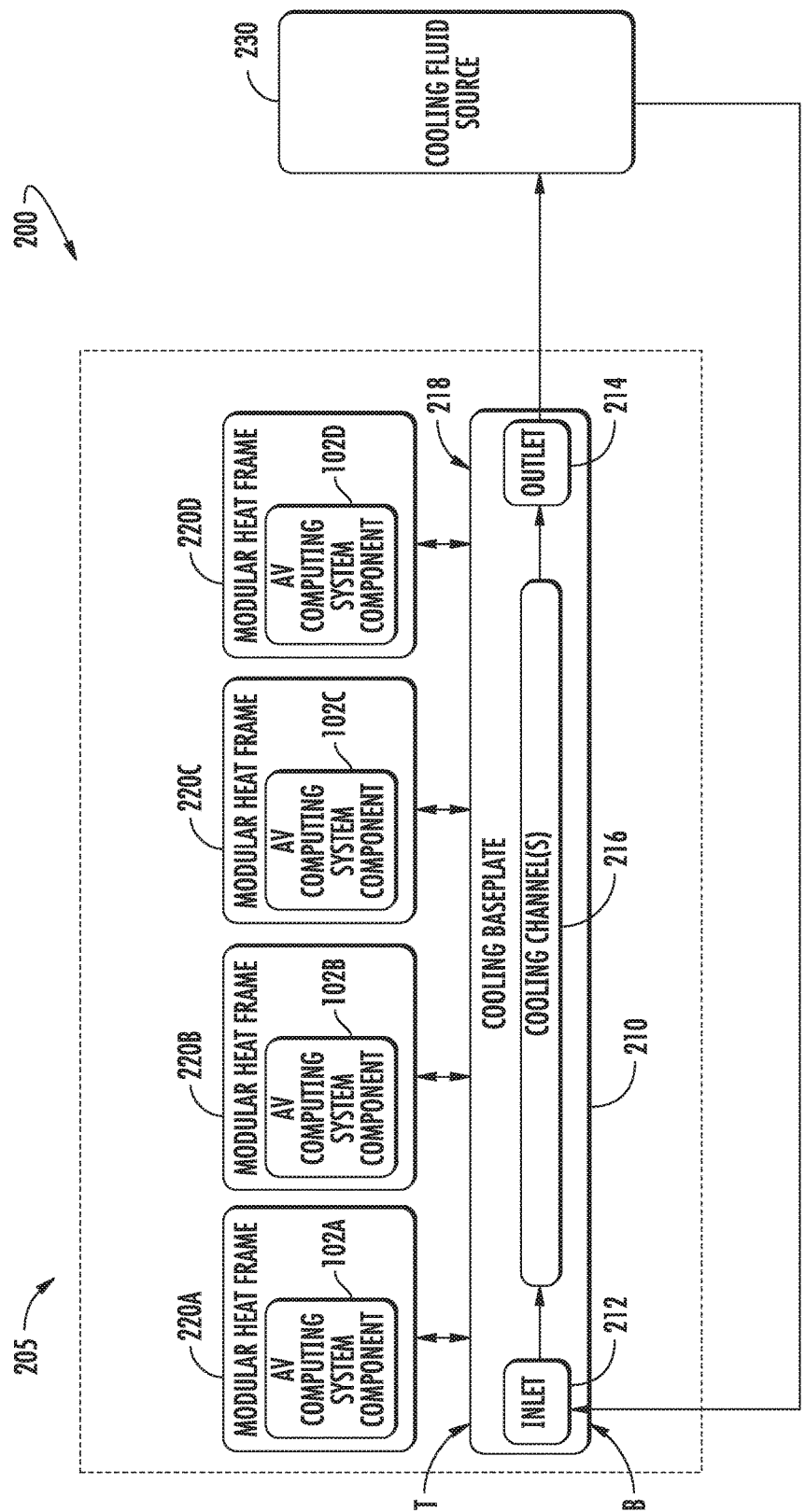
FIG. 2 depicts a block diagram of an example modular cooling system according to example aspects of the present disclosure.

For example, referring now to FIG. 2, an example modular cooling system 200 according to example aspects of the present disclosure is depicted. A modular cooling system 200 can include a modular cooling device 205, which can include a cooling baseplate 210 and one or more modular heat frames 220, and a cooling fluid source 230.

The modular cooling device 205 can be configured to provide cooling to one or more components of a vehicle computing system, such as a vehicle computing system 102. For example, the cooling baseplate 210 can include an inlet 212 configured to receive a cooling fluid and an outlet 214. One or more cooling channels 216 can be coupled between the inlet 212 and the outlet 214 of the cooling baseplate 210. The one or more cooling channels 216 can be configured to allow the cooling fluid to flow between the inlet 212 and the outlet 214 to absorb heat transferred to the cooling baseplate 210.

For example, in some implementations, the cooling fluid source 230 can be a liquid cooling fluid source. For example, in some implementations, the cooling fluid source 230 can include a thermal interface configured to receive cooling from various cooling sources, such as air-condition coolant systems, integrated coolant loops (e.g., battery coolant loops, powered electronics coolant loops), radiator coolant loops, or other cooling sources (not shown). The cooling source 230 can be configured to cool a liquid coolant, circulate the cooled liquid coolant to the inlet 212 of the cooling baseplate 210 where the liquid coolant can absorb heat from the cooling baseplate 210 via the one or more cooling channels 216, and receive the warmed liquid coolant via the outlet 214 of the cooling baseplate 210. The liquid coolant can then be recirculated to the cooling fluid source 230, which can then cool the liquid coolant further before recirculating the liquid coolant to the cooling baseplate 210 for additional cooling.

In some implementations, the cooling fluid can be a gaseous fluid, such as air circulated through one or more cooling channels 216 of a cooling baseplate 210 to provide cooling to one or more components of the vehicle computing system.

The cooling baseplate can further include at least one planar cooling surface 218. For example, the cooling fluid flowing through the one or more cooling channels 216 can provide cooling to the planar cooling surface 218 of the cooling baseplate 210. In some implementations, the cooling baseplate 210 can include two or more planar cooling surfaces 218. For example, in some implementations, the cooling baseplate 210 can include a top plate T and a bottom plate B, and each of the top plate T and bottom plate B can each include a planar cooling surface 218.

The modular cooling device 205 can further include one or more modular heat frames 220. For example, as depicted in FIG. 2, four modular heat frames 220A-D are shown. In some implementations, a singular modular heat frame 220 can be included in a modular cooling device 205. In other implementations, any number of modular heat frames 220 can be included in a modular cooling device 205. Each modular heat frame 220 can be configured to be coupled parallel to the at least one planar cooling surface. In some implementations, a plurality of modular heat frames 220 can be coupled to a planar cooling surface 218 in a parallel, co-planar orientation. For example, as shown in FIG. 2, four modular heat frames 220A-D are each coupled to the planar cooling surface 218 in parallel on the top plate T of the cooling baseplate 210. As shown, each modular heat frame 220A-D can be coupled to the planar cooling surface 218 in a surface mounted configuration. In some implementations, one or more modular heat frames 220 can additionally or alternatively be coupled to a bottom plate B of the cooling baseplate 220 (not shown).

Each modular heat frame 220A-D can be configured to house at least one autonomous vehicle computing system component. For example, each modular heat frame 220A-D is configured to house a respective autonomous vehicle computing system component 102A-D. In some implementations, each modular heat frame can be configured to house a plurality of autonomous vehicle computing system components 102. The autonomous vehicle computing system components 102 can be, for example, one or more processors, memory devices, graphics processing units (GPUs), printed chip boards (PCBs), or other computing system components. Each modular heat frame 220 can be configured to house the at least one autonomous vehicle computing system component 102 by, for example, receiving the at least one autonomous vehicle computing system component 102 into slot in a casing of the modular heat frame 220, as described herein. In this way, each modular heat frame 220 can provide support to the respective component(s) 102 housed by the modular heat frame 220.

Each modular heat frame 220 can be configured to transfer heat from the at least one autonomous vehicle computing system component 102 housed by the modular heat frame 220 to the cooling baseplate 210, such as via the at least one planar cooling surface 218. For example, in some implementations, each modular heat frame 220 can be constructed out of a thermally-conductive material, which can allow heat generated by the one or more computing system components 102 housed by the modular heat frame 220 to transfer to the modular heat frame 220. Further, each modular heat frame 220 can be configured to be coupled parallel to the at least one planar cooling surface 218. For example, each modular heat frame 220 can include a surface configured to be coupled to a planar cooling surface 218 in a parallel, surface-mounted orientation. Stated differently, each modular heat frame 220 can be configured to be coupled to the cooling baseplate 210 in a parallel configuration, such as a surface-mounted configuration. For example, at least a portion of a modular heat frame 220, such as a heatsink, vapor chamber, or other heat transfer device, can be coupled parallel to the planar cooling surface 218 to directly transfer heat from the modular heat frame 220 to the planar cooling surface 218, rather than through in-plane conduction. For example, in some implementations, each modular heat frame 220 can be received into a respective position on the planar cooling surface 218 of the cooling baseplate 210 to allow for heat transfer from the modular heat frame 220 to the cooling baseplate 210 via the at least one planar cooling surface 218. For example, in some implementations, each modular heat frame 220 can be received into (e.g., coupled or plugged into) a respective slot or socket on the planar cooling surface 218. In some implementations, a thermal grease can be applied or otherwise included between the modular heat frame 220 and the planar cooling surface 218 of the cooling baseplate 210 to aid in thermal transfer between the two components. As will discussed in greater detail with respect to FIGS. 7-10, each modular heat frame 220 can further include various components to assist in heat transfer, such as heatsinks, heat pipes, vapor chambers, air-cooled heatsinks, etc. For example, in various implementations, one or more heat transfer devices, such as one or more heatsinks, heat pipes, vapor chambers, or other component or portion of a modular heat frame 220, can be positioned between an autonomous vehicle computing system component and a planar cooling surface 218 of a cooling baseplate 210 to assist in heat transfer.

The cooling baseplate 210 can be configured to provide cooling to the one or more modular heat frames 220. For example, as the cooling fluid from the cooling fluid source 230 provides cooling to the planar cooling surface 218 of the cooling baseplate 210, the cooling fluid can absorb heat transferred to the cooling baseplate 210 from the one or more computing system components via the one or more modular heat frames 220. In this way, each modular heat frame 220 can be configured to transfer heat from the at least one autonomous vehicle computing system component 102 housed by the modular heat frame 220, and further, the cooling baseplate 210 can be configured to receive heat from the modular heat frame 220 via the planar cooling surface 218.

Figure 3:
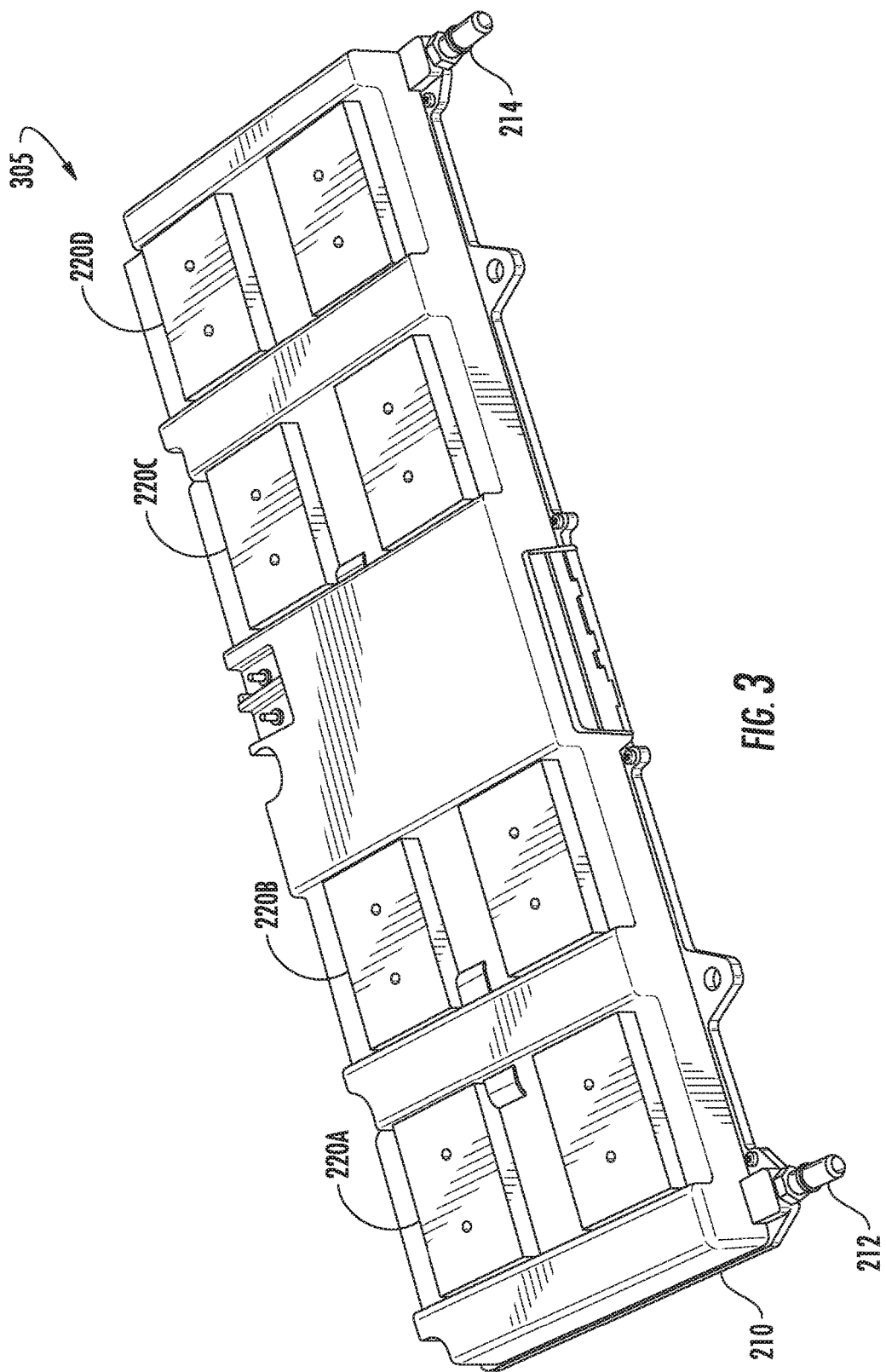
FIG. 3 depicts a perspective view of an example modular cooling device according to example aspects of the present disclosure.

Referring now to FIG. 3, a perspective view of an example modular cooling device 305 according to example aspects of the present disclosure is depicted. The modular cooling device 305 depicted can be included in a modular cooling system 200, such as the modular cooling system 200 depicted in FIG. 2. Elements that are the same or similar to those as in FIG. 2 are referred to with the same reference numerals. While FIG. 3 depicts an example modular cooling device 305 according to example aspects of the present disclosure for purposes of illustration and discussion, the example devices and systems of the present disclosure are not limited to the particularly illustrated configuration.

As shown, the modular cooling device 305 can include a cooling baseplate 210 and one or more modular heat frames 220. For example, as depicted in FIG. 3, four modular heat frames 220A-D are configured to transfer heat from one or more computing system components housed by each heat frame 220A-D to the cooling baseplate 210. For example, each modular heat frame 220A-D is received into a respective position of the cooling baseplate 210. For example, in some implementations, the cooling baseplate 210 can include a plurality of generally uniform positions (e.g., slots or sockets) configured to allow a modular heat frame 220 to transfer heat to the cooling baseplate 210, and each modular heat frame 220A-D can be configured to have generally uniform external dimensions such that any modular heat frame 220A-D can be positioned in any respective position (e.g., slot or socket) on the cooling baseplate 210.

An advantage provided by the modular cooling devices and systems of the present disclosure is that individual modular heat frames 220 can be removed, replaced, upgraded, and/or repositioned on a cooling baseplate 210 on an as-needed or as-desired basis. For example, should an autonomous vehicle computing system component 102 become damaged or be due for a scheduled upgrade, the modular heat frame 220 housing such computing system component 102 can be removed from the respective position on the cooling baseplate 210 to allow for the replacement and/or upgraded component to be installed. Additionally, variations in component sizes and configurations can be accommodated by using modular heat frames 220 adapted to specific components. The devices and systems of the present disclosure can further allow for a reduction in the size of a modular computing system and/or cooling system, and can allow for a form factor which more closely matches the serviceability and usage of more common Engine Control Units (ECUs), but at an increased computational ability.

Further, the modular cooling devices and systems of the present disclosure can allow for much lower operating temperatures and increased thermal efficiency to be achieved as compared to previous cooling devices and systems. For example, in a rack-mounted and/or rail-mounted system, such as a VPX/VITA cooling chassis, computing system component modules are mounted (i.e., coupled) orthogonal to the rails and use in-plane conduction, such as through an aluminum body, to transfer heat from computing system components to the rack/rails of the chassis. However, this in-plane conduction can result in an increased operating temperature differential from the coolant temperature, causing higher device temperatures and reduced thermal efficiency. The example cooling devices and systems of the present disclosure, however, can improve thermal efficiency by mounting modular heat frames, as well as the computing system components housed by the modular heat frames, in a surface-mounted parallel orientation adjacent to the cooling baseplate, thereby eliminating the need for in-plane conduction.

As shown in FIG. 3, in some implementations, the inlet 212 can be positioned on a first side of the cooling baseplate 210, and the outlet 214 can be positioned on a second side of the cooling baseplate 210. For example, in some implementations, the inlet 212 and the outlet 214 can be positioned on opposite sides of the cooling baseplate 210. In other implementations, the inlet 212 and the outlet 214 can be positioned proximate to one another, such as on the same side of the cooling baseplate 210.

While the modular cooling device 305 depicted in FIG. 3 depicts one possible configuration according to example aspects of the present disclosure, one of ordinary skill in the art will recognize that other configurations can similarly be used in a modular cooling device 305 or cooling system 200. For example, in some implementations, a single modular heat frame 220 may be included in a modular cooling device 305, while in other implementations, any number of modular heat frames can be included in a modular cooling device 305.

Further, in some implementations, various modular heat frames 220 may have varying external dimensions which may correspond to particular positions on a cooling baseplate 210. For example, rather than each modular heat frame 220 having generally uniform external dimensions, in some implementations, different modular heat frames 220 may be included in a modular cooling device 305, such as, for example to accommodate different types of computing system components 102 housed by the modular heat frame 220. For example, particular types of processors, memory devices, GPUs, or other computing system components may each have respective modular heat frames 220 configured to house these particular types of computing system components 102. In some implementations, such respective modular heat frames 220 may have corresponding positions, such as sockets, slots, or other corresponding positions, on a cooling baseplate 210 in order to allow for the cooling baseplate 210 to provide cooling to the modular heat frames 220. Further, the modular heat frames 220 can include various other components, as described herein.

Referring now to FIGS. 4A-C, a bottom portion of an example cooling baseplate 410 according to example aspects of the present disclosure is depicted. For example, FIG. 4A depicts a side view of a bottom plate of a cooling baseplate 410, FIG. 4B depicts a second side view of the bottom plate of the cooling baseplate 410, and FIG. 4C depicts a top-down view of the bottom plate of a cooling baseplate 410. Cooling baseplate 410 can be used as a cooling baseplate 210, such as in a cooling system 200. Elements that are the same or similar are referred to with the same reference numerals.

For example, in some implementations, the cooling baseplate 410 can include a bottom plate and a top plate (not shown) fastened together via one or more mechanical fasteners (e.g., screws) and can include a gasket 250 or other sealant coupled between the top plate and the bottom plate in order to seal the one or more cooling chambers. For example, as depicted, a gasket 250 can be positioned around a perimeter of the one or more cooling channels 216. A top plate (not shown) can be configured to seal the one or more cooling channels 216, such as by mechanically fastening the top plate to the bottom plate at one or more mechanical fastener locations 260. In some implementations, the top plate and/or the bottom plate can include a planar cooling surface 218 to which one or more modular heat frames 220 can be coupled. In some implementations, the cooling baseplate can be manufactured by casting, milling, additive manufacturing, or other suitable manufacturing process. In some implementations, a bottom plate and a top plate of a cooling baseplate can be coupled together by welding, brazing, or other suitable process.

As shown, the cooling baseplate 410 can include an inlet 212, an outlet 214, and at least one cooling channel 216 coupled between the inlet 212 and the outlet 214. For example, as shown, a single cooling channel 216 is coupled between the inlet 212 and the outlet 214. The inlet 212 can be configured to receive a cooling fluid, such as a liquid coolant, which can flow through the at least one cooling channel 216. As the cooling fluid flows through the cooling channel 216, heat can be transferred to the cooling fluid.

In some implementations, the cooling baseplate 410 can include a single cooling channel 216 which can be arranged in a straight configuration or can include one or more bends. For example, as shown in FIGS. 4A-C, the inlet 212 can be positioned on the cooling baseplate 410 on a side opposite the outlet 214, and the cooling baseplate 410 can include a single cooling channel 216 which can include three essentially parallel flow paths coupled by two U-shaped bends and two L-shaped bends. Other suitable single cooling channel 216 configurations can also be used. For example, in some configurations, the inlet 212 and the outlet 214 can be positioned proximate to one another, and a single cooling channel 216 can include two essentially parallel flow paths coupled by a single U-shaped bend and one or more L-shaped bends. Various cooling channel 216 configurations can be selected, for example, based on a pressure-drop of a cooling fluid flowing through the cooling baseplate 410.

In some implementations, the cooling baseplate 410 can be configured to receive a plurality of modular heat frames 220. For example, a plurality of modular heat frames 220 can be coupled to the cooling baseplate 410, such as by receiving each modular heat frame 220 into a respective socket or slot of a planar cooling surface 218 of the cooling baseplate 410 or otherwise coupled to a respective position on the planar cooling surface 218 of the cooling baseplate 410. For example, in some implementations, a plurality of modular heat frames 220 can be coupled to a cooling baseplate 410 in a parallel, co-planar, surface-mounted configuration.

In some implementations, the cooling baseplate 410 can include a plurality of pin fins 240 positioned within the one or more cooling channels 216. The pin fins 240 can be configured to transfer heat from the one or more modular heat frames 220 to the cooling baseplate 410. For example, as the cooling fluid flows through the one or more cooling channels 216 of the cooling baseplate 410, a plurality of pin fins 240 can be positioned within the one or more cooling channels 216 to aid in heat transfer from the one or more modular heat frames 220. For example, in some implementations, a subset of pin fins 240 can be positioned within the one or more cooling channels 216 proximate to a modular heat frame 220 position (e.g., socket, slot, or other position), such as directly below the modular heat frame 220. In some implementations, the plurality of pin fins 240 can be machined, milled, cast, or otherwise included in a bottom plate of a cooling baseplate 410 such that the pin fins 240 can extend from the bottom plate to a top plate within the one or more cooling channels 216.

As the cooling fluid flows through the one or more cooling channels 216, the plurality of pin fins 240 (or a subset thereof associated with a modular heat frame 220) can be configured to transfer heat from the respective modular heat frame 220 to the cooling baseplate 410, and further to the cooling fluid flowing through the one or more cooling channels 216. For example, as shown in FIGS. 4A-C, four subsets of pin fins 240 are positioned within the cooling channel 216. Each subset of pin fins 240 can be configured to assist in transferring heat from a respective modular heat frame 220. For example, each modular heat frame 220 can be positioned proximate to a respective subset of pin fins 240, such as on directly above the subset of pin fins 240. In some implementations, the plurality of pin fins 240 associated with a respective modular heat frame 220 can be localized on the cooling baseplate 410, such as positioned directly below the respective modular heat frame 220 position, in order to reduce the amount of pressure drop of the cooling fluid while still aiding in heat transfer from the respective modular heat frame 220. In some implementations, the plurality of pin fins 240 can be positioned throughout the cooling channel(s) 216.

In some implementations, the plurality of pin fins 240 can include a plurality of diamond-shaped pin fins 240. For example, in some implementations, diamond-shaped pin fins 240 can be milled into a bottom plate of a cooling baseplate 410 and can be arranged in a grid-like pattern. For example, in some implementations as depicted in FIGS. 4A-C, the diamond-shaped pin fins 240 can have an angle of approximately 30 degrees on a leading edge of the pin fin 240 to aid in diverting the cooling fluid flow around the diamond-shaped pin fins 240 without overly impeding the flow of the cooling fluid or causing too large of a pressure drop. An advantage provided by diamond-shaped pin fins 240 is that the pin fins 240 can be milled into a bottom plate of a cooling baseplate 410.

In some implementations, the plurality of pin fins 240 can include a plurality of rounded pin fins 240 (not shown). For example, in some implementations, rounded pin fins 240 can generally have a rounded shape (i.e., a circular or oval shape). For example, rather than having an angled leading edge such as on a diamond-shaped pin fin 240, the rounded pin fins 240 can have a curved or rounded shape. An advantage provided by rounded pin fins 240 is that as the cooling fluid flows around the rounded pin fins 240, a turbulence in the cooling fluid flow can be created, which can assist in additional heat transfer.

Referring now to FIG. 5, an example cooling baseplate 510 including a plurality of cooling channels according to example aspects of the present disclosure is depicted. The cooling baseplate 510 can be used as a cooling baseplate 210 in a modular cooling device 205 or a modular cooling system 200.

As shown, the cooling baseplate 510 can include an inlet 512, an outlet 514, and a plurality of cooling channels 516 coupled between the inlet 512 and the outlet 514. Further, in some implementations, the cooling baseplate 510 can include a first manifold 522 associated with the inlet 512, and a second manifold 524 associated with the outlet 514. The plurality of cooling channels 516 can be coupled between the first manifold 522 and the second manifold 524.

For example, the first manifold 522 can be configured to distribute the cooling fluid from the inlet 512 to the plurality of cooling channels 516, and the second manifold 524 can be configured to receive the cooling fluid from the plurality of cooling channels 516 and provide the cooling fluid to the outlet 514. In some implementations, the plurality of cooling channels 516 can be arranged in a parallel configuration, as depicted in FIG. 5. In other implementations, the plurality of cooling channels 516 can be arranged in any configuration, including U-shaped bends, L-shaped bends, or other configurations.

Similar to the cooling baseplate 410 depicted in FIGS. 4A-C, in some implementations, the cooling baseplate 510 including a plurality of cooling channels 516 can include a bottom plate and a top plate, which can be fastened via one or more mechanical fasteners or other means.

Referring now to FIG. 6, an example air-cooled cooling baseplate 610 according to example aspects of the present disclosure is depicted. For example, in some implementations, the cooling fluid provided to a cooling baseplate 610 can be air. The cooling baseplate 610 can be used as a cooling baseplate 210 in a modular cooling device 205 or a modular cooling system 200.

As depicted in FIG. 6, the cooling baseplate 610 can include an inlet 612 positioned on a first side of the cooling baseplate 610. In some implementations, an outlet (not shown) can be positioned on the opposite of the cooling baseplate 610. The cooling baseplate 610 can further include at least one cooling channel 616 coupled between the inlet 612 and the outlet. For example, the side-view depicted in FIG. 6 is from the perspective of one looking down the length of a cooling channel 616 of the cooling baseplate 610.

In some implementations, the cooling baseplate 610 can include a plurality of cooling fins 620 positioned within the at least one cooling channel 616. The cooling fins 620 can extend, for example, from a top portion T of the cooling baseplate 610 to a bottom portion B of the cooling baseplate 610, and in some implementations, the plurality of cooling fins 620 can extend the length of the cooling channel. For example, the plurality of cooling fan 620 can run essentially parallel to one another down the length of the cooling channel 616.

The cooling fins 620 can be, for example, a thermally-conductive material, such as copper, aluminum, thermally-conductive plastic, or other thermally-conductive material, and can be configured to transfer heat from the top portion T to an airflow through the cooling channel 616. The top portion T and/or the bottom portion B can be or otherwise include a planar cooling surface, and one or more modular heat frames 220 can be coupled parallel to the planar cooling surface. For example, in some implementations, a plurality of modular heat frames 220A-D can be positioned along the top portion T of the cooling baseplate 610. The modular heat frames 220A-D can transfer heat from the autonomous vehicle computing system components housed by the modular heat frames 220A-D to the top portion T of the cooling baseplate 610, and further can be transferred to an air flowing through the at least one cooling channel 616.

In some implementations, the cooling baseplate 610 can further include one or more fans 630 configured to provide a cooling airflow to the at least one cooling channel 616. In some implementations, each modular heat frame 220 can have an associated fan configured to provide a cooling airflow to a region of the cooling baseplate proximate to the modular heat frame 220. For example, as depicted in FIG. 6, four fans 630A-D are shown, with each fan associated with a respective modular heat frame 220A-D. The fans 630A-D can be positioned proximate to the inlet 612 and the cooling fluid can be a cooling airflow provided by the one or more fans 630A-D. In some implementations, a single fan 630 can provide a cooling airflow to the cooling baseplate 610. In some implementations, the cooling fluid can be an ambient airflow, such as an airflow provided due to the motion of the vehicle or other ambient airflow.

Referring now to FIGS. 7A-B, an example modular heat frame including a thermally-conductive heatsink according to example aspects of the present disclosure is depicted. FIG. 7A depicts a perspective view of a bottom portion of a modular heat frame 700, while FIG. 7B depicts a perspective view of a top portion of the modular heat frame 700. The modular heat frame 700 can be used as a modular heat frame 220 in a modular cooling device 205 or a modular cooling system 200 depicted in FIG. 2.

The modular heat frame 700 can be configured to house at least one autonomous vehicle computing system component 730. For example, in some implementations, the modular heat frame 700 can include an exterior casing 710, which can be configured to hold and/or support one or more autonomous vehicle computing system components 730. For example, in some implementations, the exterior casing 710 can be configured with various mounting positions to allow particular autonomous vehicle computing system components 730 to be housed by the modular heat frame 700. The one or more autonomous vehicle computing system components 730 can be, for example, processors, memory devices, GPUs, or other computing system components. The one or more autonomous vehicle computing system component 730 can be, for example, components in a vehicle computing system 102 depicted in FIGS. 1-2.

In some implementations, the exterior casing 710 can be configured to be coupled parallel to a planar cooling surface 218 of a cooling baseplate. For example, the in some implementations, the exterior casing 710 can be received into various positions on a cooling baseplate 210. For example, the exterior casing 710 can be sized to fit within a slot or socket on a cooling baseplate 210. In some implementations, the exterior casing 710 of a modular heat frame 700 can be constructed out of a thermally-conductive material, such as copper, aluminum, or thermally-conductive plastic. For example, the exterior casing 710 of a modular heat frame 700 can be can be manufactured by casting, milling, additive manufacturing, or other suitable manufacturing process. An advantage provided by manufacturing the modular heat frame 700 out of a thermally-conductive material is the ability of the entire modular heat frame 700 to assist in heat transfer between the one or more computing system components 730 housed by the modular heat frame 700 and the cooling baseplate 210 and/or an ambient air. For example, heat can be transferred via conduction from the modular heat frame 700 to the cooling baseplate 210, and can be transferred via radiation to the ambient air surrounding the modular heat frame 700.

In some implementations, a modular heat frame 700 can include one or more thermally-conductive heatsinks 720 configured to transfer heat from the one or more computing system components 730 housed by the modular heat frame 700. For example, in some implementations, the one or more heatsinks 720 can be constructed out of a thermally-conductive material (e.g., copper, aluminum, thermally-conductive plastic, etc.). In some implementations, the one or more computing system components 730 housed by the modular heat frame can be positioned on top of the one or more heatsinks 720 to allow for heat generated by the one or more computing system components to be transferred to the one or more heatsinks 720. For example, as depicted in FIG. 7A, in some implementations, the one or more heatsinks 720 can be positioned on a bottom portion of the modular heat frame 700 such that one or more planar surfaces of the one or more heatsinks 720 are configured to be coupled parallel to a planar cooling surface 218 of a cooling baseplate 210. Further, in some implementations, one or more heatsinks 720 can be configured to be positioned adjacent to (e.g., coupled) the cooling baseplate 210 such that heat can be transferred from the one or more heatsinks 720 of the modular heat frame 700 to the cooling baseplate 210. For example, a heatsink 720 can be coupled parallel to a planar cooling surface 218 of a cooling baseplate 210. For example, in some implementations, a modular heat frame 700 can be received into a corresponding socket or coupled to a corresponding position of a planar cooling surface 218 of a cooling baseplate 210 and the modular heat frame 700 can be thermally coupled to the cooling baseplate 210 such as, for example, by a thermal grease applied between the heatsink 720 of the modular heat frame 700 and the planar cooling surface 218 of the cooling baseplate 210.

Figure 8B:
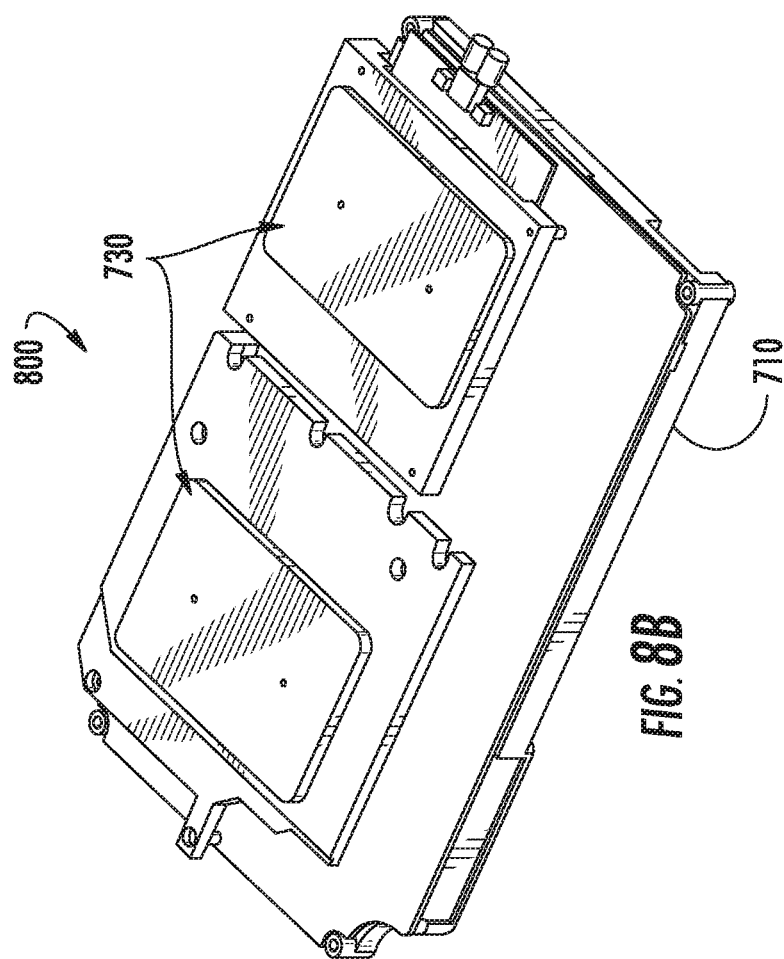
FIG. 8B depicts an example modular heat frame including a vapor chamber according to example aspects of the present disclosure.
Figure 8A:
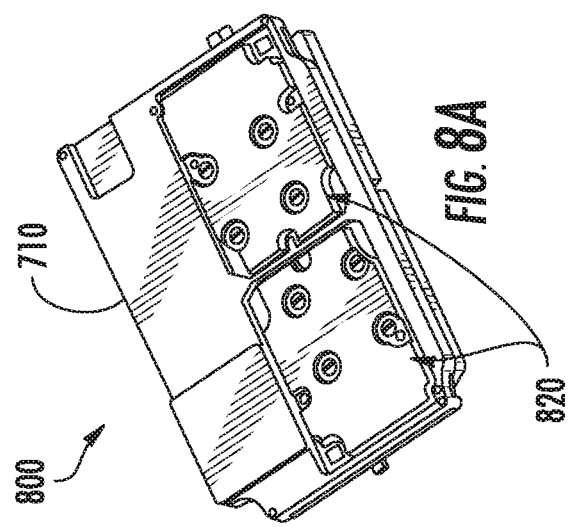
FIG. 8A depicts an example modular heat frame including a vapor chamber according to example aspects of the present disclosure.

Referring now to FIGS. 8A-B, an example modular heat frame 800 including a vapor chamber according to example aspects of the present disclosure is depicted. FIG. 8A depicts a perspective view of a bottom portion of a modular heat frame 800, while FIG. 8B depicts a perspective view of a top portion of the modular heat frame 800. The modular heat frame 800 can be used as a modular heat frame 220 in a modular cooling device 205 or a modular cooling system 200 depicted in FIG. 2.

The modular heat frame 800 is similar to the modular heat frame 700 depicted in FIG. 7. Elements that are the same or similar to those depicted in FIG. 7 are referred to with the same reference numerals. For example, the modular heat frame 800 can include an exterior casing 710, into which can be received one or more computing system components 730.

As shown in FIG. 8A, however, in some implementations, the modular heat frame 800 can include one or more vapor chambers 820 configured to transfer heat from the one or more computing system components 730 housed by the modular heat frame 800. For example, in some implementations, the one or more vapor chambers 820 can be constructed out of a thermally-conductive material (e.g., copper, aluminum, etc.) and can include a phase transition liquid. In some implementations, the one or more vapor chambers 820 can be positioned between the one or more computing system components 730 housed by the modular heat frame 800 and the planar cooling surface 218 of the cooling baseplate 210. For example, the one or more computing system components 730 housed by the modular heat frame 800 can be positioned on top of the one or more vapor chambers 820 to allow for heat generated by the one or more computing system components 730 to be transferred to the one or more vapor chambers 820. Further, in some implementations, the one or more vapor chambers 820 can be positioned on a bottom portion of the modular heat frame 800.

In some implementations, the modular heat frame 800 can then be positioned on the cooling baseplate 210 such that heat can be transferred from the one or more vapor chambers 820 of the modular heat frame 800 to the cooling baseplate 210. For example, a vapor chamber 820 can be coupled parallel to a planar cooling surface 218 of a cooling baseplate 210. For example, in some implementations, a modular heat frame 800 can be received into a corresponding socket of a planar cooling surface 218 of a cooling baseplate 210 and the modular heat frame 800 can be thermally coupled to the cooling baseplate 210 such as, for example, by a thermal grease applied between the vapor chamber(s) 820 of the modular heat frame 800 and the planar cooling surface 218 of the cooling baseplate 210. As the phase transition liquid in the vapor chamber(s) 820 proximate to the one or more computing system components 730 heats up, the phase transition liquid can turn into a vapor and travel to cooling baseplate 210 side of the vapor chamber 820. As the phase transition liquid then cools down, heat can be transferred from the phase transition liquid to the cooling baseplate 210.

Referring generally to FIGS. 7A-B and 8A-B, example modular heat frames according to example aspects the present disclosure are depicted, which can include one or more heatsinks 720 and/or vapor chambers 820. The example modular heat frame 700 and 800 are intended for illustrative purposes only. One of ordinary skill in the art will recognize that other suitable configurations can be used for a modular heat frame 700 and/or 800.

Figure 9:
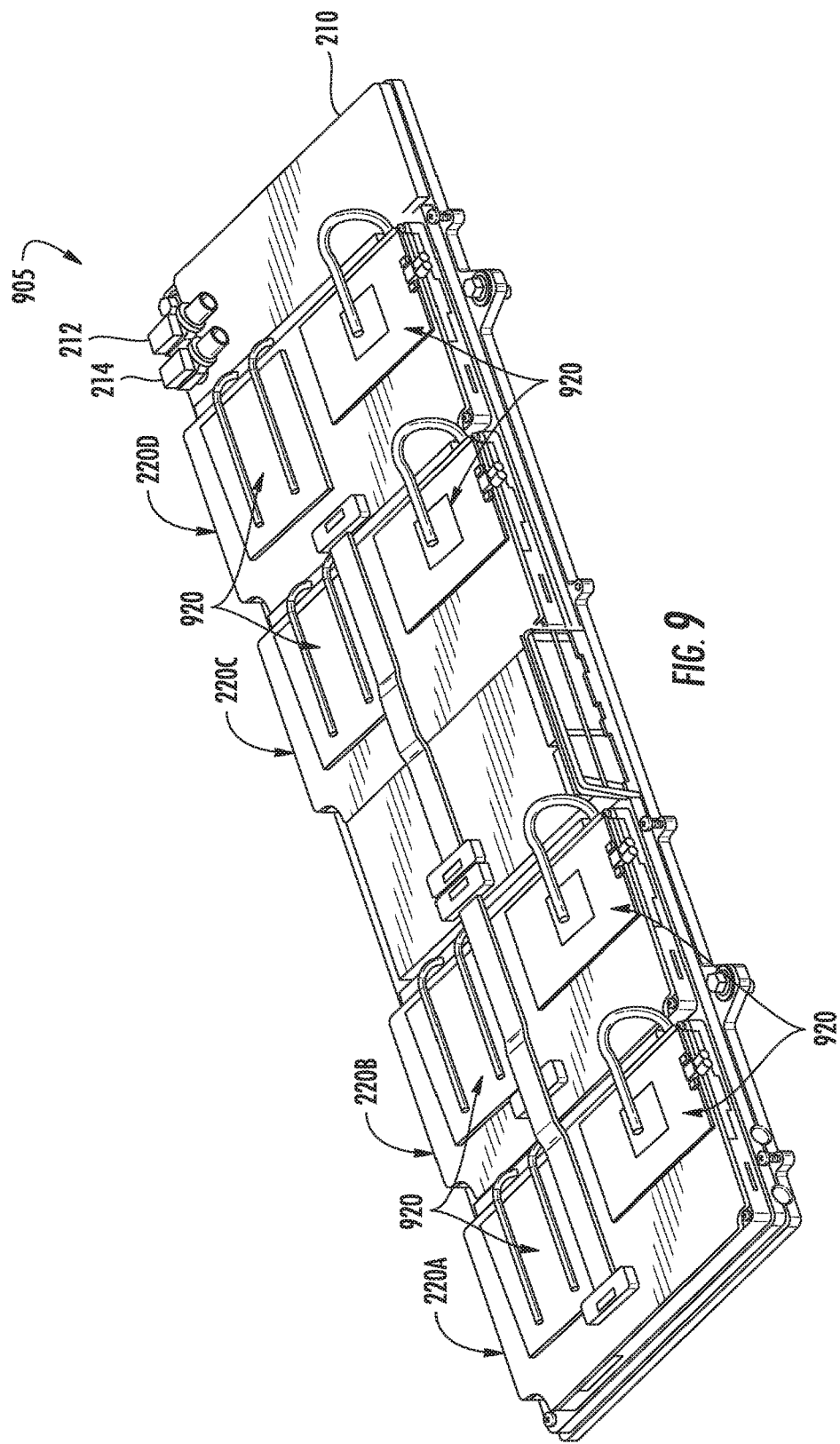
FIG. 9 depicts an example modular cooling device including a heat pipe according to example aspects of the present disclosure.

Referring now to FIG. 9, an example modular cooling device 905 including a plurality of modular heat frames 220 including heat pipes according to example aspects of the present disclosure is depicted. The example modular cooling device 905 depicted in FIG. 9 can be used in a modular cooling system, such as a modular cooling system 200 depicted in FIG. 2. Elements that are the same or similar to other elements discussed herein are referred to with the same reference numerals. For example, as shown, a cooling baseplate 210 can be configured to provide cooling to four modular heat frames 220A-D.

In some implementations, a modular heat frame can include one or more heat pipes 920 configured to transfer heat from the one or more computing system components housed by the modular heat frame 220. For example, as shown, each modular heat frame 220A-D includes three heat pipes 920 positioned on a top portion of the respective modular heat frame 220A-D. In some implementations, the one or more heat pipes 920 can be constructed out of a thermally-conductive material (e.g., copper, aluminum, etc.) and can include a phase transition liquid.

As shown, in some implementations, a first end of a heat pipe 920 can be positioned on top of the one or more computing system components housed by the modular heat frame 220 to allow for heat generated by the one or more computing system components to be transferred to the one or more heat pipes 920. In some implementations, a second end of a heat pipe can be configured to transfer heat to a bottom portion of the modular heat frame 220, such as a heatsink or other heat transfer device. As the liquid in the first side of the heat pipe 920 absorbs heat from the one or more computing system components, the phase transition liquid can turn into a vapor and travel to the second side of the heat pipe 920. As the phase transition liquid cools at the second side of the heat pipe 920, heat can be transferred from the phase transition liquid to the second side.

Further, as shown, in some implementations the modular heat frame 220 can then be positioned on the cooling baseplate 210 (such as coupled parallel) such that heat can be transferred from the heat pipe 920 of the modular heat frame 220 to the cooling baseplate 210. For example, in some implementations, a modular heat frame 220 can be housed by a corresponding socket of a planar cooling surface 218 of a cooling baseplate 210 and the modular heat frame 220 can be thermally coupled to the cooling baseplate 210 such as, for example, by a thermal grease applied between a heatsink or other heat transfer device of the modular heat frame 220 and the planar cooling surface 218 of the cooling baseplate 210.

Additionally, as shown in FIG. 9, in some implementations, the inlet 212 and the outlet 214 can be positioned proximate to one another on the cooling baseplate 210. For example, in some implementations, the cooling baseplate 210 can be generally rectangular in shape, and both the inlet 212 and outlet 214 can be positioned on the same side of the cooling baseplate 210 and on the same end of the cooling baseplate 210. In other implementations, the inlet 212 and the outlet 214 can be positioned at opposite ends of the same side of the cooling baseplate, as shown in FIG. 2. In yet other implementations, the inlet 212 and the outlet 214 can be positioned on opposite sides and opposite ends of the cooling baseplate 210. Any number of suitable inlet 212 and outlet 214 configurations can be used to accommodate different configurations within a vehicle 10. Further, any number of suitable cooling channel configurations can be used between the inlet 212 and the outlet 214.

Figure 10:
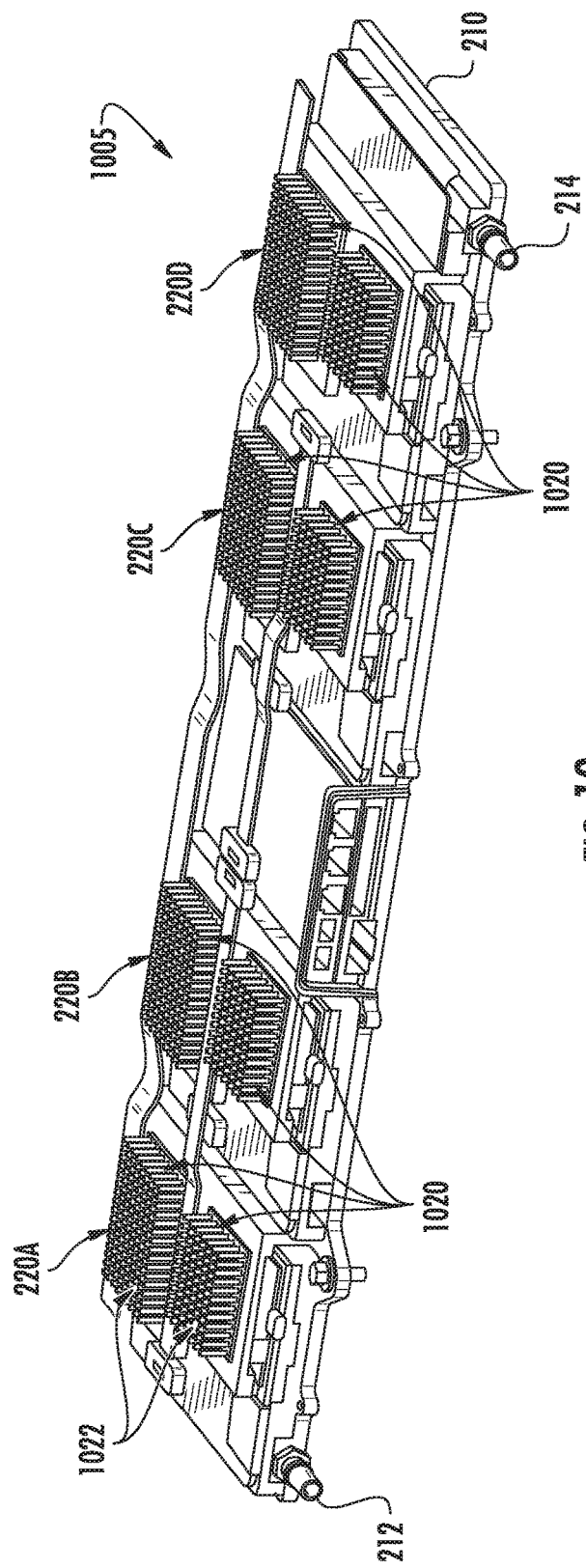
FIG. 10 depicts an example modular cooling device including an air-cooled heatsink according to example aspects of the present disclosure.

Referring now to FIG. 10, an example modular cooling device 1005 including a plurality of modular heat frames 220 including air-cooled heatsinks 1020 according to example aspects of the present disclosure is depicted. The example modular cooling device 1005 depicted in FIG. 10 can be used in a modular cooling system, such as a modular cooling system 200 depicted in FIG. 2. Elements that are the same or similar to other elements discussed herein are referred to with the same reference numerals. For example, as shown, a cooling baseplate 210 can be configured to provide cooling to four modular heat frames 220A-D.

In some implementations, a modular heat frame 220 can include one or more air-cooled heatsinks 1020 configured to transfer heat from the one or more computing system components housed by the modular heat frame 220 to an ambient air surrounding the modular heat frame. For example, as shown, each modular heat frame 220A-D includes two air-cooled heatsinks 1020 positioned on a top portion of the respective modular heat frame 220A-D.

In some implementations, an air-cooled heatsink 1020 can include a plurality of thermally-conductive fins 1022 positioned on top of the air-cooled heatsink 1020. In some implementations, a bottom portion of the air-cooled heatsink 1020 can be constructed out of a thermally-conductive material, such as aluminum or copper. Heat can be transferred from the one or more computing system components housed by the modular heat frame 220 to the thermally-conductive heatsink 1020, and dissipated into the ambient air surrounding the modular heat frame 220 via the plurality of thermally-conductive fins 1022.

The example modular cooling devices 205/905/1005, modular cooling systems 200, cooling baseplates 210/510/610, and modular heat frames 220/700/800 of the present disclosure are intended for illustrative purposes. The inherent flexibility of such modular devices and systems allows for a great variety of possible configurations and combinations.

While the present subject matter has been described in detail with respect to various specific example implementations thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A modular cooling device for an autonomous vehicle computing system, comprising:
    a cooling baseplate, comprising:
        at least one planar cooling surface;
        an inlet configured to receive a cooling fluid;
        an outlet; and
        at least one cooling channel coupled between the inlet and the outlet, the at least one cooling channel configured to allow the cooling fluid to flow between the inlet and the outlet and provide cooling to the at least one planar cooling surface; and
    one or more modular heat frames;
    wherein each modular heat frame is configured to house at least one autonomous vehicle computing system component;
    wherein each modular heat frame comprises a heat transfer device positioned on a bottom portion of the modular heat frame, the at least one autonomous vehicle computing system component housed by each respective modular heat frame positioned on top of the heat transfer device, the heat transfer device positioned between the at least one autonomous vehicle computing system component and the at least one planar cooling surface;
    wherein each modular heat frame further comprises a heat pipe, each heat pipe comprising a first end positioned on a top portion of the at least one autonomous vehicle computing system component housed by the respective modular heat frame and a second end configured to transfer heat from the at least one autonomous vehicle computing system component housed by the respective modular heat frame to the heat transfer device;
    wherein the heat transfer device of each respective modular heat frame is further configured to be coupled parallel to the at least one planar cooling surface in a surface-mounted orientation; and
    wherein each modular heat frame is further configured to transfer heat from the at least one autonomous vehicle computing system component housed by the respective modular heat frame from the heat transfer device to the cooling fluid via the at least one planar cooling surface.

2. The modular cooling device of claim 1, wherein the cooling fluid comprises a liquid cooling fluid.

3. The modular cooling device of claim 1, wherein the cooling baseplate further comprises a plurality of pin fins positioned within the at least one cooling channel.

4. The modular cooling device of claim 3, wherein the plurality of pin fins comprise a plurality of diamond-shaped pin fins or rounded pin fins.

5. The modular cooling device of claim 3, wherein the one or more modular heat frames comprises a first modular heat frame;
wherein the plurality of pin fins comprise a first subset of pin fins configured to transfer heat from the first modular heat frame to the cooling baseplate.

6. The modular cooling device of claim 1, wherein the at least one cooling channel comprises a plurality of cooling channels.

7. The modular cooling device of claim 6, wherein the cooling baseplate further comprises a first manifold associated with the inlet and a second manifold associated with the outlet; and
wherein the plurality of cooling channels are coupled between the first manifold and the second manifold.

8. The modular cooling device of claim 1, wherein the heat transfer device of at least one of the one or more modular heat frames comprises a vapor chamber.

9. The modular cooling device of claim 1, wherein the one or more modular heat frames comprises a plurality of modular heat frames; and
wherein each modular heat frame of the plurality is configured to be mounted to the at least one planar cooling surface in a co-planar orientation.

10. The modular cooling device of claim 1, wherein the heat transfer device of at least one of the one or more modular heat frames comprises a thermally-conductive heatsink.

11. The modular cooling device of claim 10, wherein the thermally-conductive heatsink comprises a copper, aluminum, or thermally-conductive plastic heatsink.

12. The modular cooling device of claim 1, wherein at least one of the one or more modular heat frames comprises an air-cooled heatsink; and
wherein the air-cooled heatsink is configured to transfer heat from the autonomous vehicle computing system component housed by the at least one of the modular heat frames to an ambient air.

13. The modular cooling device of claim 1, wherein the cooling fluid comprises air.

14. The modular cooling device of claim 13, wherein the cooling baseplate further comprises plurality of cooling fins positioned within the at least one cooling channel.

15. The modular cooling device of claim 13, further comprising a fan configured to provide a cooling airflow to the at least one cooling channel.

16. A modular cooling system for an autonomous vehicle computing system, comprising:
a cooling fluid source; and
a modular cooling device, comprising:
a cooling baseplate, comprising:
at least one planar cooling surface;
an inlet configured to receive a cooling fluid from the cooling fluid source;
an outlet; and
one or more cooling channels coupled between the inlet and the outlet, the one or more cooling channels configured to allow the cooling fluid to flow between the inlet and the outlet and provide cooling to the at least one planar cooling surface; and
at least one modular heat frame;
wherein the at least one modular heat frame is configured to house at least one autonomous vehicle computing system component;
wherein the at least one modular heat frame comprises a heat transfer device positioned on a bottom portion of the at least one modular heat frame, the at least one autonomous vehicle computing system component housed by the at least one modular heat frame positioned on top of the heat transfer device, the heat transfer device positioned between the at least one autonomous vehicle computing system component and the at least one planar cooling surface;
wherein the at least one modular heat frame further comprises a heat pipe, the heat pipe comprising a first end positioned on a top portion of the at least one autonomous vehicle computing system component housed by the at least one modular heat frame and a second end configured to transfer heat from the at least one autonomous vehicle computing system component housed by the at least one modular heat frame to the heat transfer device;
wherein the heat transfer device of the at least one modular heat frame is further configured to be coupled parallel to the at least one planar cooling surface in a surface-mounted orientation; and
wherein the at least one modular heat frame is further configured to transfer heat from the at least one autonomous vehicle computing system component housed by the at least one modular heat frame from the heat transfer device to the cooling fluid via the at least one planar cooling surface.

17. The modular cooling system of claim 16, wherein the at least one modular heat frame comprises a plurality of modular heat frames; and
wherein each modular heat frame of the plurality is configured to be mounted to the at least one planar cooling surface in a co-planar orientation.

18. The modular cooling system of claim 16, where the heat transfer device of the at least one modular heat frame comprises a vapor chamber or a thermally-conductive heatsink.

19. The modular cooling system of claim 16, wherein the cooling fluid source comprises a liquid cooling fluid source.

20. An autonomous vehicle, comprising:
an autonomous vehicle computing system comprising a plurality of autonomous vehicle computing system components; and
a modular cooling system, comprising:
a cooling fluid source; and
a modular cooling device, comprising:
a cooling baseplate, comprising:
at least one planar cooling surface;
an inlet configured to receive a cooling fluid from the cooling fluid source;
an outlet; and
one or more cooling channels coupled between the inlet and the outlet, the one or more cooling channels configured to allow the cooling fluid to flow between the inlet and the outlet and provide cooling to the at least one planar cooling surface; and
at least one modular heat frame;
wherein the at least one modular heat frame is configured to house at least one autonomous vehicle computing system component from the plurality;
wherein the at least one modular heat frame comprises a heat transfer device positioned on a bottom portion of the at least one modular heat frame, the at least one autonomous vehicle computing system component housed by the at least one modular heat frame positioned on top of the heat transfer device, the heat transfer device positioned between the at least one autonomous vehicle computing system component and the at least one planar cooling surface;

wherein the at least one modular heat frame further comprises a heat pipe, the heat pipe comprising a first end positioned on a top portion of the at least one autonomous vehicle computing system component housed by the at least one modular heat frame and a second end configured to transfer heat from the at least one autonomous vehicle computing system component housed by the at least one modular heat frame to the heat transfer device;

wherein the heat transfer device of the at least one modular heat frame is further configured to be coupled parallel to the at least one planar cooling surface in a surface-mounted orientation; and wherein the at least one modular heat frame is further configured to transfer heat from the at least one autonomous vehicle computing system component housed by the at least one modular heat frame from the heat transfer device to the cooling fluid via the at least one planar cooling surface.

* * * * *